US011339011B2

(12) United States Patent
Kuwahara

(10) Patent No.: US 11,339,011 B2
(45) Date of Patent: *May 24, 2022

(54) SUBSTRATE TREATING SYSTEM AND SUBSTRATE TRANSPORTING METHOD

(71) Applicant: SCREEN Holdings Co., Ltd., Kyoto (JP)

(72) Inventor: Joji Kuwahara, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/005,516

(22) Filed: Aug. 28, 2020

(65) Prior Publication Data

US 2021/0061587 A1  Mar. 4, 2021

(30) Foreign Application Priority Data

Aug. 30, 2019 (JP) .............................. JP2019-158578

(51) Int. Cl.
  *H01L 21/67* (2006.01)
  *B65G 47/91* (2006.01)
  *G03F 7/20* (2006.01)
  *H01L 21/677* (2006.01)

(52) U.S. Cl.
  CPC ......... *B65G 47/91* (2013.01); *G03F 7/70733* (2013.01); *H01L 21/677* (2013.01)

(58) Field of Classification Search
  None
  See application file for complete search history.

(56) References Cited

U.S. PATENT DOCUMENTS

| 5,844,662 A | * | 12/1998 | Akimoto | ........... H01L 21/67173 |
| | | | | 355/27 |
| 2005/0027387 A1 | | 2/2005 | Fujishima | ..................... 700/112 |
| 2015/0279713 A1 | * | 10/2015 | Kokabu | ............ H01L 21/67276 |
| | | | | 414/222.12 |

FOREIGN PATENT DOCUMENTS

| JP | H09-045613 A | 2/1997 |
| JP | 2000-183019 A | 6/2000 |
| JP | 2005-051089 A | 2/2005 |
| JP | 2016-201526 A | 12/2016 |

* cited by examiner

*Primary Examiner* — Ronald P Jarrett
(74) *Attorney, Agent, or Firm* — Ostrolenk Faber LLP

(57) ABSTRACT

Disclosed is a substrate treating system and a substrate transporting method. A substrate transport mechanism of an indexer block can take a substrate W into and out of a carrier placed on a platform. Moreover, the substrate transport mechanism transports the substrate W between two treatment layers at different height positions in a first treating block and a second treating block. Accordingly, any delivery block configured to move substrates between two treatment layers in an up-down direction is not necessarily provided between the indexer block and the treating block as in the prior art. This achieves suppression of a footprint of the substrate treating system.

11 Claims, 17 Drawing Sheets

SUBSTRATE TREATING SYSTEM AND SUBSTRATE TRANSPORTING METHOD

CROSS-REFERENCE TO RELATED APPLICATIONS

This application claims priority to Japanese Patent Application No. 2019-158578 filed Aug. 30, 2019, the subject matter of which is incorporated herein by reference in entirety.

BACKGROUND OF THE INVENTION

Technical Field

The present invention relates to a substrate treating system for treating a substrate and a substrate transporting method for the substrate treating system. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

Description of the Related Art

A currently-used substrate treating apparatus (substrate treating system) includes an indexer block (hereinafter referred to as an "ID block" as appropriate) and a treating block (for example, see Japanese Unexamined Patent Application Publication No. 2016-201526A and H09-045613A).

The treating block is connected to the ID block. A substrate platform is disposed between the treating block and the ID block for delivering substrates to each other. A carrier platform for placing carriers is provided in the ID block. The carrier accommodates the substrates. The ID block includes an indexer mechanism. The indexer mechanism takes a substrate from a carrier placed on the carrier platform, and transports the taken substrate to the substrate platform. In addition, the indexer mechanism returns the substrate treated by the treating block from the substrate platform to the carrier.

Japanese Unexamined Patent Application Publication No. 2016-201526A discloses a substrate treating system including a delivery block disposed between an ID block and a treating block. The delivery block includes a plurality of the substrate platforms (including a buffer unit) arranged in an up-down direction, and two transfer devices arranged across the substrate platforms. The two transfer devices are arranged in a direction (Y direction) perpendicular to a direction (X direction) in which the ID block and the treating block are arranged. Each of the two transfer mechanisms moves vertically to load and unload the substrates into and from the substrate platforms arranged in the up-down direction.

Moreover, Japanese Unexamined Patent Application Publication No. H09-045613A discloses a substrate treating apparatus in which a coating-treatment block, a cassette station (corresponding to an ID block), and a developing-treatment block are linearly connected in a horizontal direction in this order. The cassette station is configured so that four cassettes containing either an untreated substrate or a treated substrate can be arranged therein. In addition, a first substrate platform for alignment of the substrate is provided at a boundary between the coating-treatment block and the cassette station, and a second substrate platform for alignment of the substrate is provided at a boundary between the cassette station and the developing-treatment block. One transport mechanism in the cassette station transports the substrates through the substrate platforms to the coating-treatment block and the developing-treatment block. Here, each of the blocks does not consist of a plurality of treatment layers arranged in the up-down direction but a single treatment layer.

SUMMARY OF THE INVENTION

However, the currently-used apparatus possesses the following problems. That is, the currently-used apparatus each include two treatment layers arranged in the up-down direction as described in Japanese Unexamined Patent Publication No. 2016-201526A. The transfer devices each transfer substrates to and from several substrate platforms arranged in the up-down direction to transport the substrates between the two treatment layers. Here, the transfer devices and the substrate platforms are provided in the delivery block disposed between the ID block and the treating block. Therefore, the delivery block makes the footprint of the substrate treating system larger.

The present invention has been made regarding the state of the art noted above, and its object is to provide a substrate treating system and a substrate transporting method that allow reduction in footprint of the substrate treating system.

Solution to Problem

To achieve the object, the present invention provides a configuration as follows. One aspect of the present invention provides a substrate treating system including an indexer block where a platform for placing a carrier capable of accommodating a substrate is provided, a first treating device including a plurality of treatment layers arranged in an up-down direction, and a second treating device including a plurality of treatment layers arranged in the up-down direction. The first treating device, the indexer block, and the second treating device are connected in this order in a horizontal direction. The indexer block includes a first indexer mechanism capable of taking a substrate into and out of a carrier placed on the platform and configured to transport the substrate, and a substrate buffer configured to place a plurality of the substrates therein. The first indexer mechanism transports a substrate between two treatment layers disposed at different height positions in the first treating device and the second treating device.

With the substrate treating system according to the present invention, the footprint of the substrate treating system is suppressible. That is, the first indexer mechanism of the indexer block can take the substrates into and out of carriers placed on the platform. Moreover, the first indexer mechanism transports a substrate between two treatment layers disposed at different height positions in the first treating device and the second treating device. Accordingly, any delivery block configured to move the substrates between two treatment layers in the up-down direction does not need to be provided between the indexer block and the treating block as in the prior art. This achieves suppression of the footprint of the substrate treating system.

Moreover, the substrate treating system described above is preferably configured as under. The treatment layers of the first treating device and the second treating device each include a substrate transport mechanism configured to transport a substrate, and a treating unit configured to perform a predetermined treatment on the substrate. When transporting a substrate between two treatment layers disposed at an equal height position in the first treating device and the second treating device, the substrate transport mechanism in each of the treatment layers delivers the substrate through the substrate buffer. When transporting a substrate between two treatment layers disposed at different height positions in the first treating device and the second treating device, the first indexer mechanism transports the substrate between two buffer units of the substrate buffer disposed at height positions corresponding to the height positions of the treatment layers.

When a substrate is transported across the indexer block between two treatment layers disposed at the equal height position, the substrate can be delivered not using the first indexer mechanism but using the substrate buffer. Moreover, when a substrate is transported across the indexer block between two treatment layers disposed at the equal height position, the substrate can be delivered using the first indexer mechanism and the substrate buffer. Here, when the substrate can be transported without using the first indexer mechanism, the load on the first indexer mechanism can be reduced.

Moreover, the substrate treating system described above is preferably configured as under. The treatment layers of the first treating device and the second treating device each include a substrate transport mechanism configured to transport a substrate, and a treating unit configured to perform a predetermined treatment on the substrate. When transporting a substrate between two treatment layers disposed at different height positions in the first treating device and the second treating device, the first indexer mechanism directly transports the substrate between two treating units of the two treatment layers without passing through the substrate buffer.

Thus, the substrate transport mechanism of the treatment layer of the first treating device can omit operation of taking the substrate from the treating unit in the first treating device and transporting the taken substrate to the substrate buffer. In addition, the substrate transport mechanism of the treatment layer of the second treating device can also omit operation of taking the substrate from the treating unit in the second treating device and transporting the taken out substrate to the substrate buffer. Accordingly, the load on the substrate transport mechanisms of the two treatment layers can be reduced.

Moreover, it is preferred in the substrate treating system described above that when transporting a substrate between two treatment layers disposed at an equal height position in the first treating device and the second treating device, the substrate transport mechanism in each of the treatment layers delivers the substrate through the substrate buffer. This allows transportation of the substrate across the indexer block between two treatment layers disposed at the equal height position without using the first indexer mechanism. Accordingly, the load of the first indexer mechanism can be reduced.

Moreover, it is preferred in the substrate treating system described above that the first indexer mechanism directly transports the substrate from the carrier placed on the platform to the treating unit of the treatment layer in at least either the first treating device or the second treating device without passing through the substrate buffer. Thus, the substrate transport mechanism of the treatment layer can omit operation of taking the substrate from the substrate buffer and transporting the taken substrate to the treating unit of the treatment layer. Accordingly, the load on the substrate transport mechanisms of the treatment layers can be reduced.

Moreover, it is preferred in the substrate treating system described above that the first indexer mechanism takes a plurality of the substrates from the carrier placed on the platform simultaneously, and directly transports the substrates one by one to the treating unit of the treatment layer in at least either the first treating device or the second treating device without passing through the substrate buffer. It is assumed that the first indexer mechanism takes two substrates from a carrier simultaneously. By transporting these two substrates to the treating units one by one, the frequency of reciprocation from the carrier to the treating unit can be reduced. Accordingly, enhanced transportation efficiency of the substrate can be achieved.

Moreover, it is preferred in the substrate treating system described above that the first indexer mechanism directly transports the substrate from the treating unit of the treatment layer in at least either the first treating device or the second treating device to the carrier placed on the platform without passing through the substrate buffer. Thus, the substrate transport mechanism of the treatment layer can omit operation of taking the substrate from the treating unit and transporting the taken substrate to the substrate buffer. Accordingly, the load on the substrate transport mechanisms of the treatment layers can be reduced.

Moreover, the substrate treating system described above is preferably configured as under. The treatment layers of the first treating device and the second treating device each include a substrate transport mechanism configured to transport a substrate, and a treating unit configured to perform a predetermined treatment on the substrate. When transporting a substrate between two treatment layers disposed at different height positions in the first treating device and the second treating device, the first indexer mechanism directly transports the substrate between the substrate buffer and the treating unit of one of the two treatment layers. Thus, the substrate transport mechanism of one treatment layer, including the treating unit, of the two treatment layers can omit operation of transporting a substrate between that treating unit and the substrate buffer.

Moreover, the substrate treating system described above is preferably configured as under. The indexer block further includes a second indexer mechanism configured to transport a substrate. The second indexer mechanism is disposed opposite to the first indexer mechanism across the substrate buffer. The first indexer mechanism and the second indexer mechanism are arranged in a direction perpendicular with respect to a direction where the first treating device and the second treating device are arranged side by side. Thus, the load on the first indexer mechanism can be reduced. In addition, a large number of substrates can be sent into the substrate treating system, and a large number of substrates can be taken from the substrate treating system.

Moreover, it is preferred that the substrate treating system described above further includes an adjacent treating unit adjacent to the first indexer block, disposed in the treatment layer of at least either the first treating device or the second treating device, and configured to receive the substrate directly transported by the first indexer mechanism without passing through the substrate buffer. Thus, the substrate transport mechanism of the treatment layer can omit operation of taking the substrate from the substrate buffer and transporting the taken substrate to the adjacent treating unit of the treatment layer. Accordingly, the load on the substrate transport mechanisms of the treatment layers can be reduced.

Moreover, another aspect of the present invention provides a substrate transporting method for a substrate treating system, the substrate treating system including an indexer block where a platform for placing a carrier capable of accommodating a substrate is provided, a first treating device including a plurality of treatment layers arranged in an up-down direction, and a second treating device including a plurality of treatment layers arranged in the up-down direction. The first treating device, the indexer block, and the second treating device are connected in this order in a horizontal direction. The indexer block includes therein a first indexer mechanism capable of taking a substrate into and out of a carrier placed on the platform and configured to transport the substrate, and a substrate buffer configured to place a plurality of the substrates therein. The substrate transporting method includes a transporting step of causing the first indexer mechanism to transport a substrate between two treatment layers disposed at different height positions in the first treating device and the second treating device.

With the substrate treating method according to the present invention, the footprint of the substrate treating system is suppressible. That is, the first indexer mechanism of the indexer block can take the substrates into and out of carriers placed on the platform. Moreover, the first indexer mechanism transports a substrate between two treatment layers disposed at different height positions in the first treating device and the second treating device. Accordingly, any delivery block configured to move the substrates between two treatment layers in the up-down direction does not need to be provided between the indexer block and the treating block as in the prior art. This achieves suppression of the footprint of the substrate treating system.

Advantageous Effects of Invention

With the substrate treating system and the substrate transporting method according to the present invention, the footprint can be suppressed.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIRST EMBODIMENT

Figure 1:
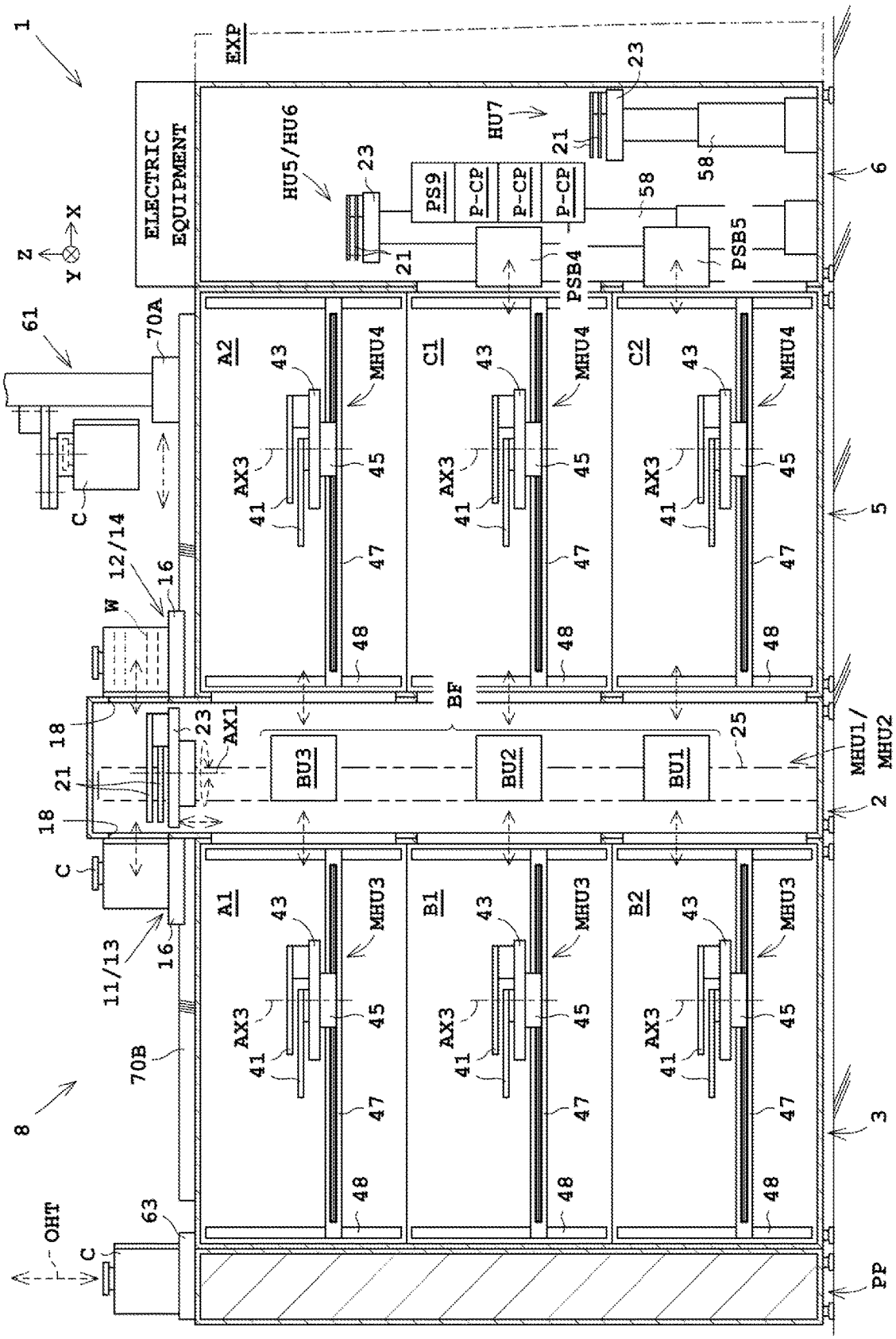
FIG. 1 is a longitudinal cross-sectional view of a substrate treating apparatus according to a first embodiment.
Figure 2:
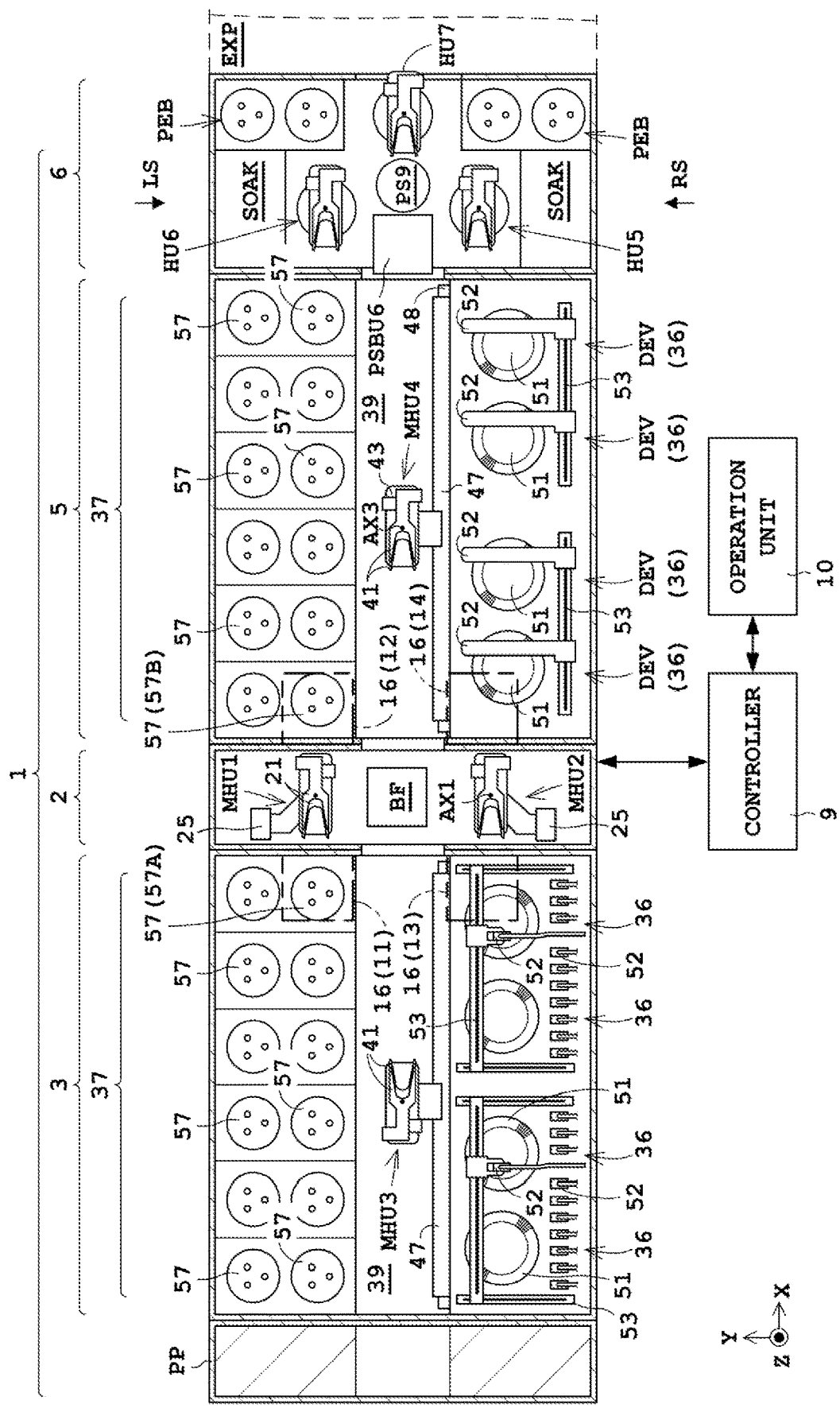
FIG. 2 is a transverse cross-sectional view of the substrate treating apparatus according to the first embodiment.
Figure 3:
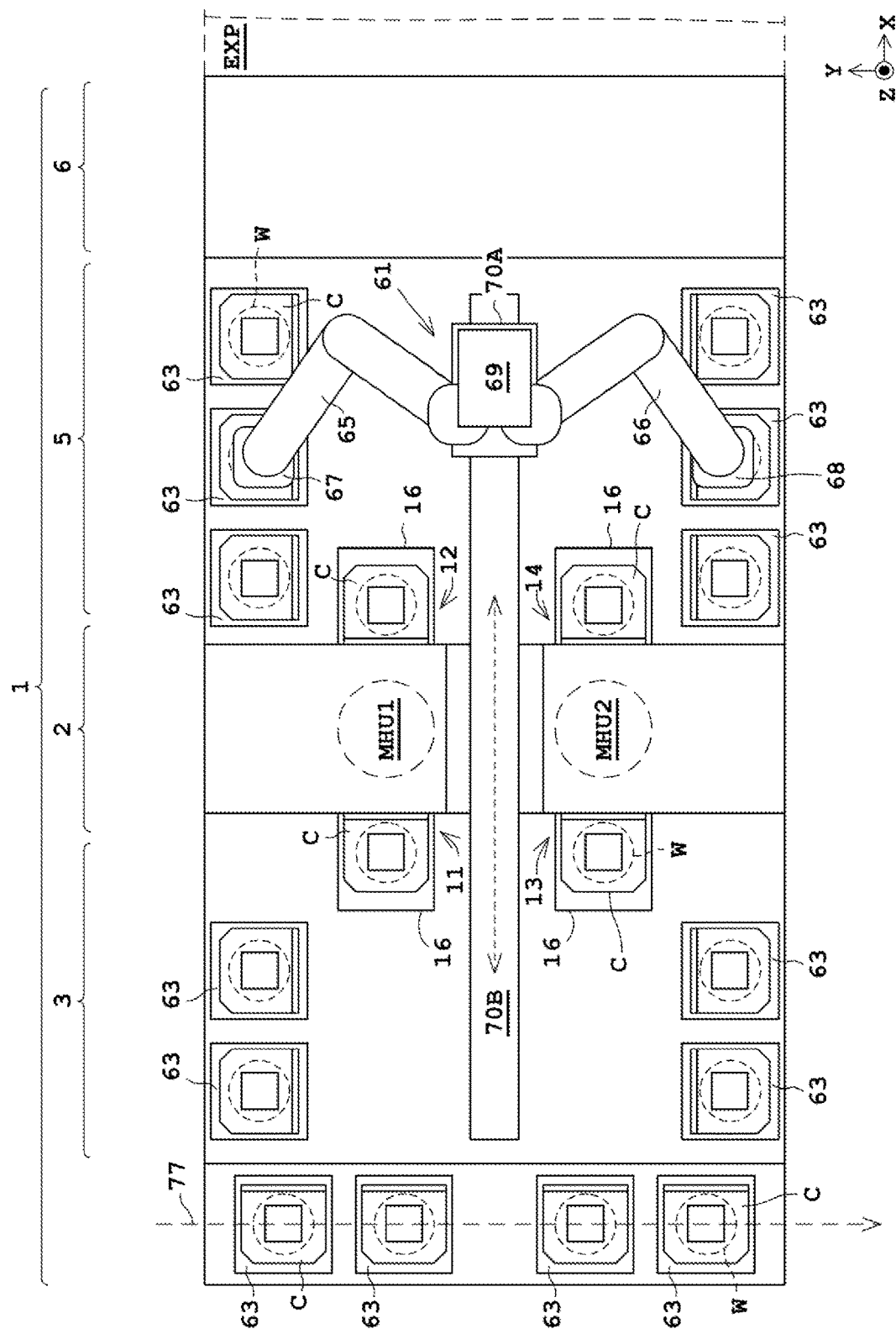
FIG. 3 is a plan view of the substrate treating apparatus according to the first embodiment.

A first embodiment of the present invention will now be described with reference to the drawings. FIG. 1 is a longitudinal cross-sectional view of a substrate treating apparatus 1 according to a first embodiment. FIG. 2 is a horizontal cross-sectional view of a substrate treating apparatus 1 according to the first embodiment. FIG. 3 is a plan view of the substrate treating apparatus 1 according to the first embodiment.

Configuration of Substrate Treating Apparatus 1

Reference is made to FIG. 1. The substrate treating apparatus (substrate treating system) 1 includes an ID block (indexer block) 2, a first treating block 3, a second treating block 5, an interface block (hereinafter, appropriately referred to as "IF block") 6, and a carrier buffer device 8. The first treating block 3, ID block 2, the second treating block 5 and IF block 6 are linearly connected in a horizontal direction in this order.

Note that, in FIGS. 1 and 2, reference numeral PP denotes, for example, a housing block for accommodating pipes for sending a treating liquid and an electric wire or the like. In addition, in this embodiment, the first treating block 3 corresponds to the first treating device of the present invention. The second treating block 5 and the IF block 6 correspond to the second treating device of the present invention.

Moreover, as shown in FIG. 2, the substrate treating apparatus 1 includes a controller 9 and an operation unit 10. The controller 9 includes, for example, a central processing unit (CPU). The controller 9 controls components of the substrate treating apparatus 1. An operation unit 10 includes a display unit (e.g., liquid crystal monitor), a memory unit, and an input unit. The memory unit includes, for example, at least one of a read-only memory (ROM), random-access memory (RAM), and a hard disk. The input unit includes at least one of a keyboard, a mouse, a touch panel, and various buttons. The memory unit stores conditions for substrate treatments and operation programs necessary for controlling the substrate treating apparatus 1.

(1-1) Configuration of ID Block 2

The ID block 2 includes four openers (carrier platforms) 11 to 14, two substrate transport mechanisms (robots) MHU1, MHU2, and a substrate buffer BF, as shown in FIGS. 2 and 3. The two substrate transport mechanisms MHU1, MHU2, and the substrate buffer BF are disposed inside the ID block 2. Note that the substrate transport mechanism MHU1 corresponds to the first indexer mechanism in the present invention. Moreover, the substrate transport mechanism MHU2 corresponds to the second indexer mechanism in the present invention.

(1-1-1) Configurations of Openers 11 to 14 and the Like

The four openers 11 to 14 are provided on an outer wall of the ID block 2. The two openers 11, 12 are disposed around the first substrate transport mechanism MHU1 so that the first substrate transport mechanism MHU1 can load and unload the substrate W into and from the carrier C. In FIGS. 2 and 3, the two openers 11, 12 are arranged in a front-back direction (X direction) across the substrate transport mechanism MHU1. Similar to the two openers 11, 12, the two openers 13, 14 are disposed around the second substrate transport mechanism MHU2 so that the second substrate transport mechanism MHU2 can load and unload the substrate W into and from the carrier C. The two openers 13, 14 are arranged in the front-back direction across the second substrate transport mechanism MHU2.

Each of the four openers 11 to 14 includes a platform 16, an opening 18, a shutter member (not shown), and a shutter member driving mechanism (not shown), as shown in FIG. 1. The platform 16 is used to place the carrier C.

The carrier C can accommodate a plurality (e.g., 25) of substrates W. For instance, a FOUP (Front Open Unified Pod) or SMIF (Standard Mechanical Inter Face) pod is used as the carrier C. That is, the carrier C includes, for example, a carrier body with which an opening for taking in and out the substrate W is provided, and a lid for closing the opening. The substrates W are housed in the carrier body.

The opening 18 is used to pass the substrate W. A shutter member opens and closes the opening 18, and attaches and detaches the lid to and from the carrier body of the carrier C. The shutter member driving mechanism includes an electric motor to drive the shutter member. After removing the lid from the carrier body, the shutter member is moved horizontally (Y direction) or downward (Z direction) along the opening 18, for example.

The platform 16 is disposed above the first treating block 3 and the second treating block 5. Specifically, the platforms 16 of the two openers 11, 13 are disposed above the first treating block 3. Moreover, the platforms 16 of the two openers 12, 14 are disposed above the second treating block 5. Here, the platforms 16 of the two openers 11, 13 may be provided on an upper surface or the roof of the first treating block 3. Moreover, the platforms 16 of the two openers 12, 14 may be provided on an upper surface or a roof of the second treating block 5.

(1-1-2) Configuration of Substrate Transport Mechanisms MHU1, MHU2

As shown in FIG. 2, the two substrate transport mechanisms MHU1, MHU2 are arranged across the substrate buffer BF. That is, the second substrate transport mechanism MHU2 is disposed opposite to the first substrate transport mechanism MHU1 across the substrate buffer BF. In addition, the two substrate transport mechanisms MHU1, MHU2 are arranged in a direction (Y direction) perpendicular to the direction (X direction) in which the first treating block 3 and the second treating block 5 are arranged side by side.

The first substrate transport mechanism MHU1 can transport a substrate W between the carrier C placed on the platforms 16 of the two openers 11, 12, and the substrate buffer BF. Moreover, the first substrate transport mechanism MHU1 can transport a substrate W between the carrier C placed on the respective platform 16 of the two openers 11, 12, and the heat treating unit 37 which is to be mentioned later. On the other hand, the second substrate transport mechanism MHU2 can transport a substrate W between the carrier C placed on the respective platform 16 of the two openers 13, 14 and the substrate buffer BF.

Figure 4:
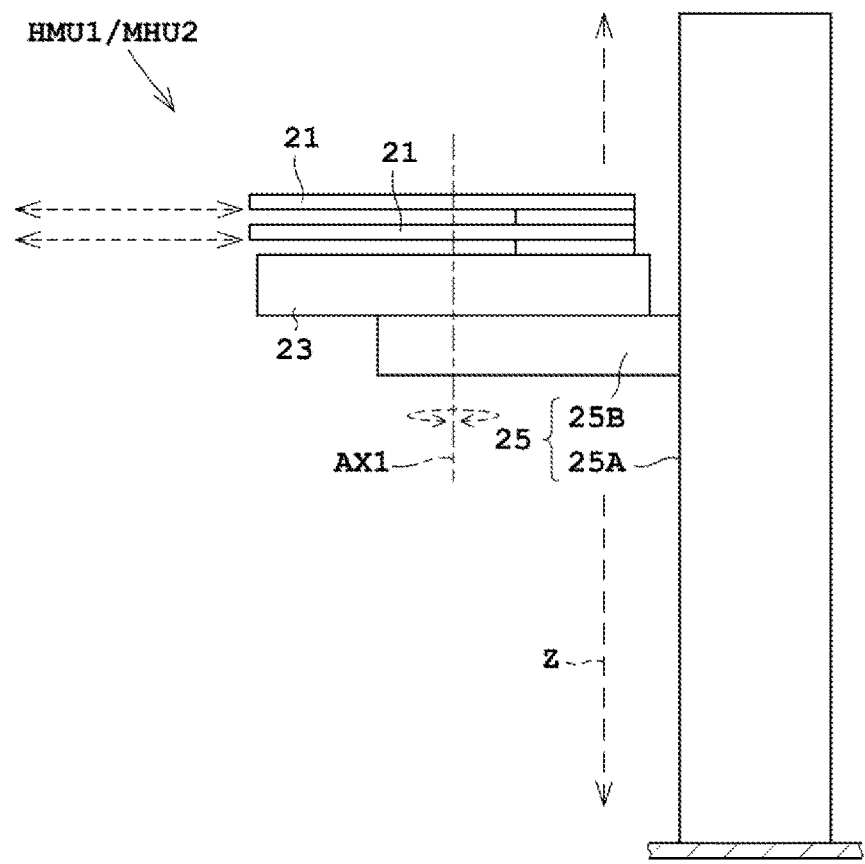
FIG. 4 illustrates a substrate transport mechanism of the indexer block.
Figure 5:
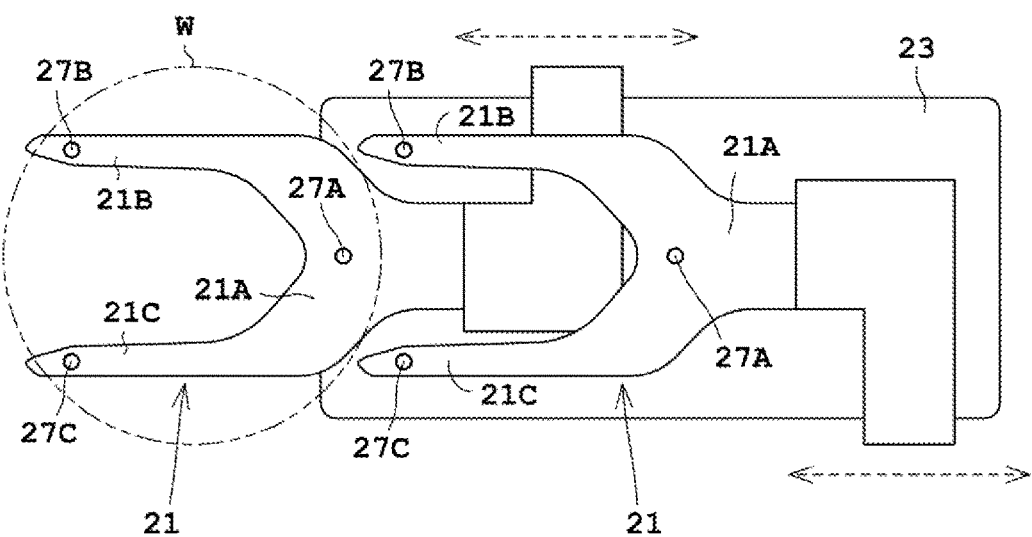
FIG. 5 is a plan view of two hands and a forward/rearward driving unit.

Reference is made to FIGS. 4 and 5. The two substrate transport mechanisms MHU1, MHU2 each includes two hands 21, a forward/rearward driving unit 23, and a lifting/lowering rotation driving unit 25. The two hands 21 each hold a substrate W. The two hands 21 are movable forward and backward in the horizontal direction individually. Therefore, it is possible to take out one substrate W from the carrier C, or take out two substrates W at the same time.

As shown in FIG. 5, the hand 21 includes one basic part 21A, and two tip parts 21B, 21C branched from the basic part 21A. The hand 21 is formed in a Y-shape, a U-shape, or a two-pronged fork shape. Three suction portions 27A to 27C for holding a substrate W by sucking the substrate W are provided on the basic part 21A and the two tip parts 21B, 21C, respectively. Each of the three suction portions 27A to 27C is configured so that a suction force is applied by a pump connected through a pipe, for example. Each of the two substrate transport mechanisms MHU1, MHU2 includes two hands 21, but may include three or more hands 21.

The forward/rearward driving unit 23 supports each of the hands 21 movably, and moves each of the hands 21 forward and rearward. In order to drive one hand 21, the forward/rearward driving unit 23 includes, for example, an electric motor, a straight screw shaft, a movable member having a hole portion engaging with the screw shaft, and a guide portion for guiding the movable member.

The lifting/lowering rotation driving unit 25 lifts, lowers, and rotates the forward/rearward driving unit 23 to thereby lift, lower, and rotate the two hands 21. As shown in FIG. 4, the lifting/lowering rotation driving unit 25 includes a strut portion 25A and a rotating portion 25B. The strut portion 25A extends in the upward/downward direction. The strut portion 25A is fixed to the floor of the ID block 2. Accordingly, the position of the strut portion 25A (i.e., the lifting/lowering rotation driving unit 25) in the horizontal direction (XY direction) is fixed without being moved. The rotating portion 25B rotates forward/rearward driving unit 23 around a vertical axis AX1. An electric motor causes the lifting/lowering rotation driving unit 25 to perform the lifting, lowering, and rotating.

(1-1-3) Configuration of Substrate Buffer BF

The substrate buffer BF places a plurality of substrates W thereon. As shown in FIG. 2, the substrate buffer BF is disposed in the middle (center) of the first treating block 3 and the second treating block 5. Accordingly, both the substrate transport mechanism MHU3 of the first treating block 3 and the substrate transport mechanism MHU4 of second treating block 5 are capable of loading and unloading the substrates W with respect to the substrate buffer BF. That is, the four substrate transport mechanisms MHU1 to MHU4 with the addition of two substrate transport mechanisms MHU1, MHU2 of the ID block 2 can take the substrates W, placed on the substrate buffer BF, from four directions.

The substrate buffer BF includes three buffer units BU1 to BU3, as shown in FIG. 1. The three buffer units BU1 to BU3 are arranged in a row in the up-down direction. Each of the three buffer units BU1 to BU3 includes a plurality (e.g., 15) of substrate platforms (not shown) arranged in the up-down direction for placing the substrates W.

The first buffer unit BU1 is provided in the same stage (i.e., first floor) as a treatment layer B2 of the first treating block 3 and a treatment layer C2 of the second treating block 5. The second buffer unit BU2 is provided in the same stage (i.e., second floor) as a treatment layer B1 of the first treating block 3 and a treatment layer C1 of the second treating block 5. The third buffer unit BU3 is provided in the same stage (i.e., third floor) as a treatment layer A1 of the first treating block 3 and a treatment layer A2 of the second treating block 5.

Here in FIG. 1, for example, the treatment layer A1 among the three treatment layers B2, B1, A1 of the first treating block 3 is arranged in the same stage (equal height position) as the treatment layer A2 among the three treatment layers C2, C1, A2 of the second treating block 5. Likewise, the treatment layer B1 is arranged in the same stage as the treatment layer C1. The treatment layer B2 is arranged in the same stage as the treatment layer C2. Moreover, the two treatment layers A1, A2 differ in stage from the four treatment layers B1, B2, C1, C2.

(1-2) Configuration of Treating Blocks 3, 5

Reference is made to FIGS. 1 and 2. The first treating block 3 includes the three treatment layers B2, B1, A1. The three treatment layers B2, B1, A1 are arranged in the up-down direction in a stacked manner. Moreover, the second treating block 5 includes the three treatment layers C2, C1, A2. The three treatment layers C2, C1, A2 are arranged in the up-down direction in a stacked manner. For instance, the two treatment layers A1, A2 form an antireflection film on a substrate W. The two treatment layers B1, B2 form a photoresist film on the substrate W. The two treatment layers C1, C2 perform a developing treatment on the substrate W. The three treatment layers A1, B1, C1 perform the same treatment on the substrate W as the treatment by the three treatment layers A2, B2, C2, respectively.

In this embodiment, the first treating block 3 includes the three treatment layers B2, B1, A1, and the second treating block 5 includes the three treatment layers C2, C1, A2. However, the number of the treatment layers is not limited to three. That is, the first treating block 3 may include a plurality of treatment layers, and the second treating block 5 may include a plurality of treatment layers.

The three treatment layers B2, B1, A1 each include a substrate transport mechanism MHU3, a plurality of liquid treating units 36, a plurality of heat treating units 37, and a transportation space 39 (see FIG. 2). Moreover, the three treatment layers C2, C1, A2 each include a substrate transport mechanism MHU4, a plurality of liquid treating units 36, a plurality of heat treating units 37, and a transportation space 39. The transportation space 39 is a longitudinal rectangular space in the X-direction in plan view. The substrate transport mechanisms MHU3, MHU4 are disposed in the transportation spaces 39, respectively. The liquid treating unit 36 and the heat treating units 37 are arranged across the transportation space 39. Moreover, the liquid treating unit 36 and the heat treating unit 37 are each arranged along the longitudinal direction of the transportation space 39 (X direction).

(1-2-1) Configuration of Substrate Transport Mechanisms MHU3, MHU4

The substrate transport mechanisms MHU3, MHU4 each transport the substrates W. The substrate transport mechanisms MHU3, MHU4 each include two hands 41, a forward/rearward driving unit 43, a rotation driving unit 45, a first movement mechanism 47, and a second movement mechanism 48. The two hands 41, the forward/rearward driving unit 43 and the rotation driving unit 45 are configured in the same manner as the two hands 21, the forward/rearward driving unit 23, and the rotating portion 25B of the first substrate transport mechanism MHU1, respectively, for example. That is, the two hands 41 each hold a substrate W. The two hands 41 each include one base part and two tip parts branched from the base part. The base part and the two tip parts are each provided with the suction portions for holding the substrate W by sucking the substrate W.

Moreover, the two hands 41 are each movably attached to the forward/rearward driving unit 43. The forward/rearward driving unit 43 moves the two hands 41 forward and rearward individually. The rotation driving unit 45 rotates the forward/rearward driving unit 43 around a vertical axis AX3. This achieves orientation of the two hands 41. The first movement mechanism 47 can move the rotation driving unit 45 in the front-back direction (X-direction) of FIG. 1. The second movement mechanism 48 can move the first movement mechanism 47 in the up-down direction (Z-direction) of FIG. 1. The two movement mechanisms 47, 48 allow the two hands 41 and the forward/rearward driving unit 43 to move in the X-Z direction.

The forward/rearward driving unit 43, the rotation driving unit 45, the first movement mechanism 47 and the second movement mechanism 48 each include an electric motor.

(1-2-2) Configuration of Liquid Treating Unit 36

Figure 6:
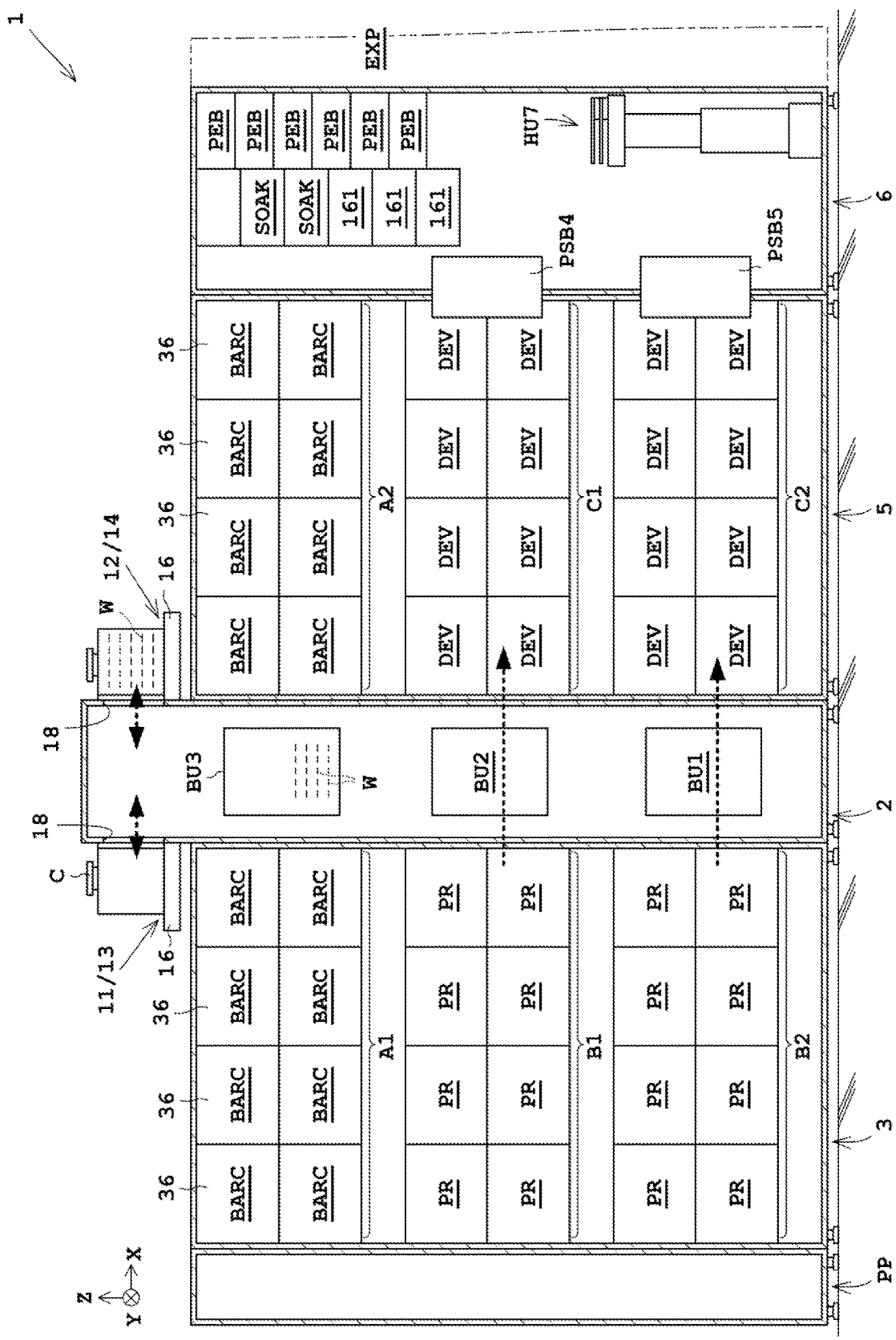
FIG. 6 is a right side view of the substrate treating apparatus according to the first embodiment.

FIG. 6 is a right side view of the substrate treating apparatus 1. Each of the six treatment layers A1, A2, B1, B2, C1, C2 (hereinafter referred to as "six treatment layers (e.g., A1)" as appropriate) includes eight liquid treating units 36. The eight liquid treating units 36 can be arranged in two levels in the up-down direction×four lines in the horizontal direction. In FIG. 6, the two treatment layers A1, A2 each includes eight coating units BARC, for example. The two treatment layers B1, B2 each include eight coating units PR. Moreover, the two treatment layers C1, C2 each include eight developing units DEV. Note that the number and types of the liquid treating units 36 are variable as required.

The liquid treating units 36 (the coating units BARC, PR and the developing unit DEV) each include a holding rotation portion 51, nozzles 52 and a nozzle moving mechanism 53, as shown in FIG. 2. The holding rotation portion 51 holds the back face of a substrate W by, for example, vacuum adsorption, and rotates the held substrate W around the vertical axis (Z direction). The nozzles 52 dispense a treating liquid (for example, a liquid for forming an antireflection film, a photoresist liquid, or a developer) to the substrate W. The nozzles 52 is connected to a treating liquid supply source via pipes, respectively, and the pipes are each provided with a pump and an on-off valve. The nozzle moving mechanism 53 moves the nozzles 52 to any positions. The holding rotation portion 51 and the nozzle moving mechanism 53 each include an electric motor, for example.

(1-2-3) Configuration of Heat Treating Unit 37

Figure 7:
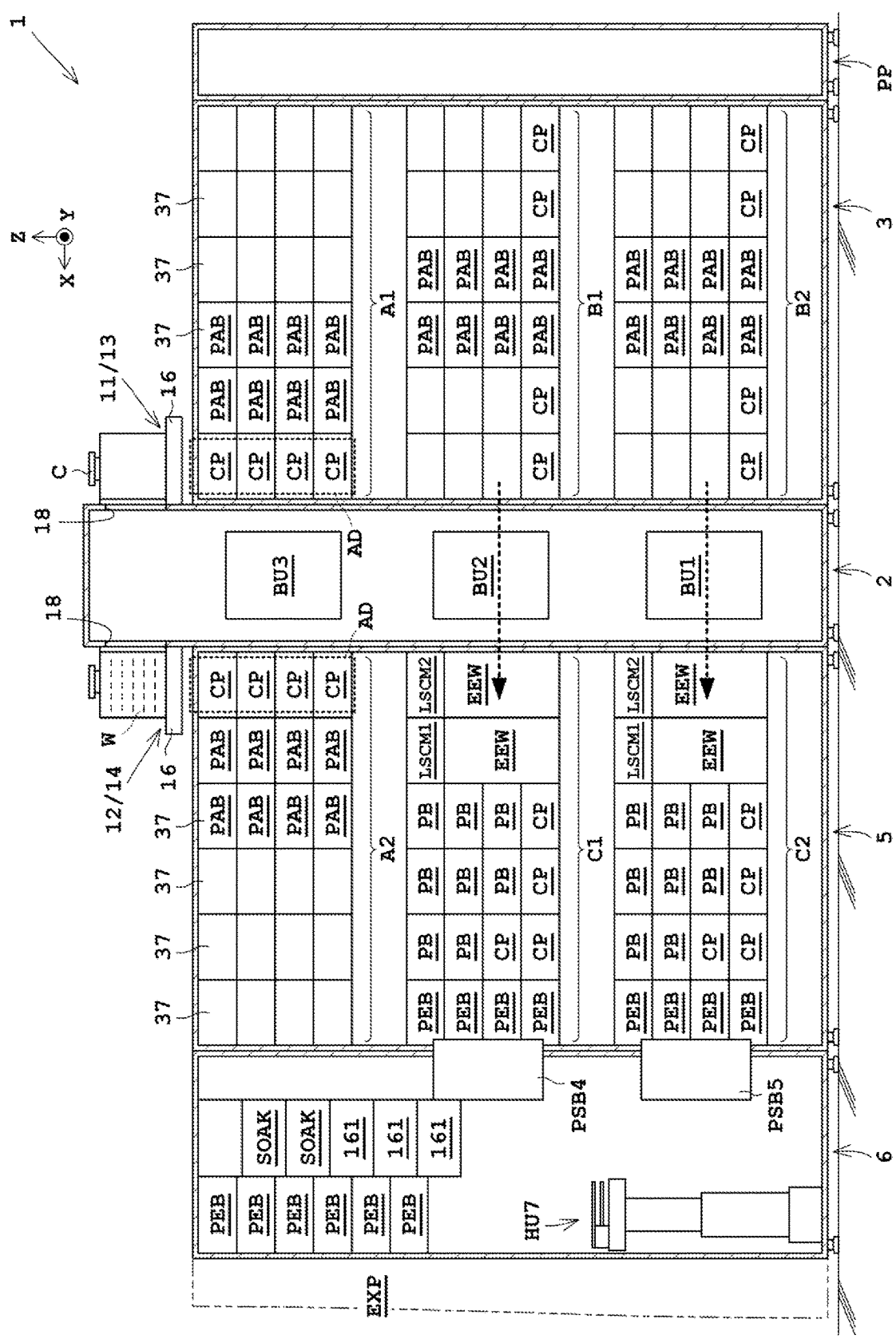
FIG. 7 is a left side view of the substrate treating apparatus according to the first embodiment.

FIG. 7 is a left side view of the substrate treating apparatus 1. Each of the six treatment layers (e.g., A1) may include the twenty-four heat treating units 37. The twenty-four heat treating units 37 are arranged in 4 levels×6 lines. In order to perform a heat treatment (predetermined treatment) on the substrate W, the heat treating units 37 each include a plate 57 for placing the substrate W (see FIG. 2). The heat treating units 37 each include a heater, such as an electric heater, for heating the plate 57. Moreover, the heat treating units 37 also include, for example, a water-cooled circulation mechanism or a Peltier element for cooling the plate 57.

The heat treating units 37 include the original heat treating units mainly performing a heat treatment and a cooling treatment, and edge exposing units EEW and inspection units LSCM1, LSCM2 as treating units not performing any heat treatment and any cooling treatment. In this embodiment, the treating unit other than the liquid treating unit 36 is referred to as the heat treating unit 37.

In FIG. 7, each of the two treatment layers A1, A2 includes four cooling units CP and eight heating units PAB, for example. The cooling units CP each cool the substrates W. The heating units PAB each perform a bake treatment on the substrate W after coating. In FIG. 7, each of the four cooling units CP in the two treatment layers A1, A2 is arranged adjacent to the ID block 2. Such a unit arranged adjacent to the ID block 2 is referred to as "adjacent treating unit AD" in this embodiment. The four cooling units CP (adjacent treating units AD) are each provided with, for example, two substrate inlets 59A, 59B for taking the substrate W in and out from two directions (see FIG. 8).

Figure 8:
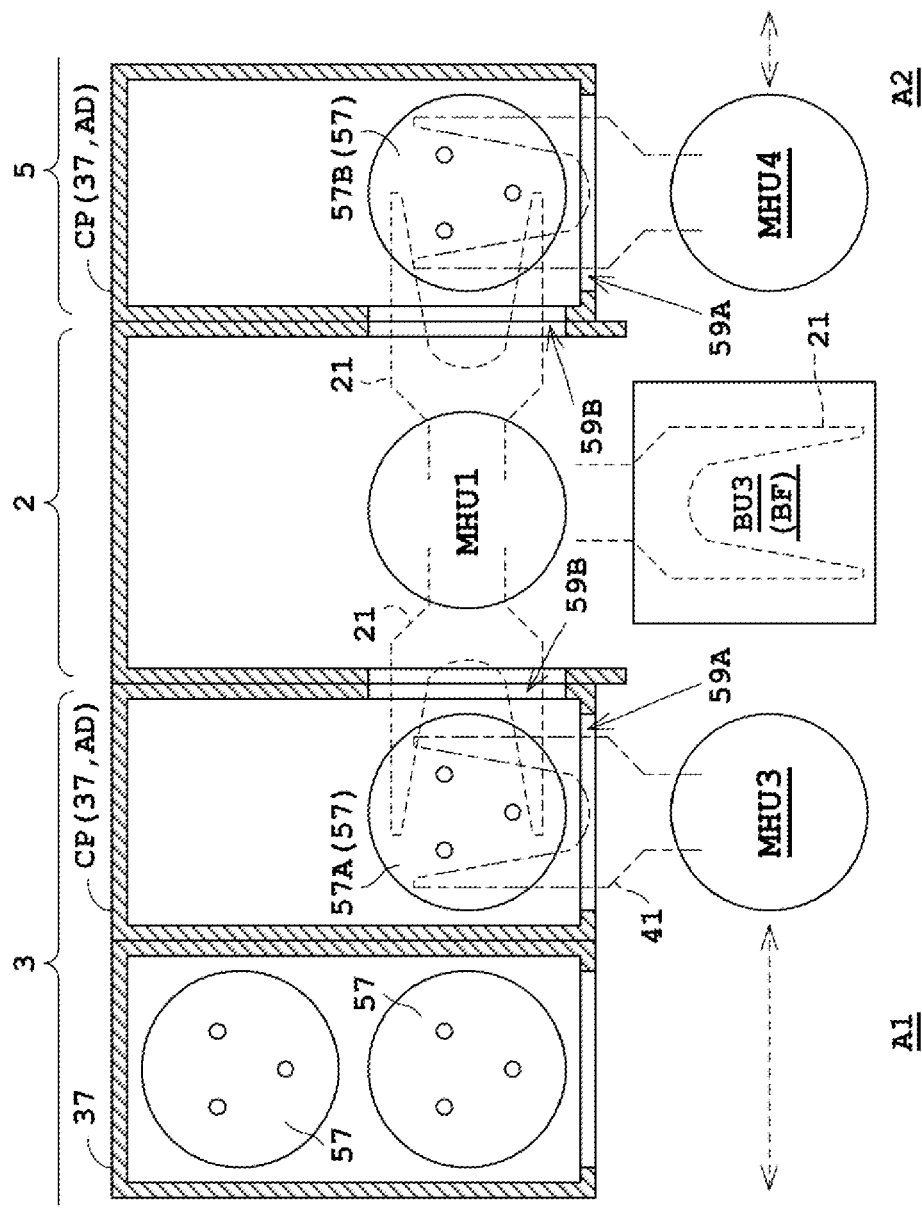
FIG. 8 is a diagram for explanation of a heat treating unit capable of transporting a substrate from two directions.

As shown in FIGS. 7 and 8, in the treatment layer A1 where the four cooling units CP are arranged, the substrate transport mechanism MHU3 of the treatment layer A1 can transport the substrate W to the plate 57A of the cooling unit CP through the substrate inlet 59A, and the substrate transport mechanism MHU1 of the ID block 2 can transport the substrate W to the plate 57A through the substrate inlet 59B. Moreover, in the treatment layer A2, the substrate transport mechanism MHU4 of the treatment layer A2 can transport the substrate to the plate 57B of the cooling unit CP through the substrate inlet 59A, and the substrate transport mechanism MHU1 of the ID block 2 can transport the substrate W to the plate 57B through the substrate inlet 59B. Note that when the heat treating unit 37 corresponds to the cooling unit CP, the plate 57 may be one, as shown in FIG. 8.

Moreover, each of the two treatment layers B1, B2 includes four cooling units CP and eight heating units PAB, for example. Furthermore, each of the two treatment layers C1, C2 includes four cooling unit CP, four post-exposure bake treatment units PEB, eight post-bake units PB, the two edge exposing units EEW, and two inspection units LSCM1, LSCM2.

The post-exposure bake treatment units PEB each perform a baking treatment on the substrate W after a coating. The post-bake units PB each perform a baking treatment on the substrate W after the developing treatment. The edge exposing units EEW each perform the exposure treatment of the periphery of the substrate W. The two inspection units LSCM1, LSCM2 each include a CCD-camera or an image sensor. The inspection units LSCM1 each inspect a coated film (e.g., a photoresist film). The inspection units LSCM2 each inspect the substrate W after the developing treatment.

Note that at least one of the six treatment layers (e.g., A1) may include adhesion enhancing treatment units AHP. The adhesion enhancing treatment units AHP apply an adhesion enhancing agent, such as hexamethyldisilazane (HMDS), to substrates W and heat the substrates W The heating units PAB, the post-exposure bake treatment units PEB, the post-bake units PB, and the adhesion enhancing treatment units AHP each have a cooling function. Moreover, the number, types, and positions of the heat treating units 37 are appropriately variable.

(1-3) Configuration of IF Block 6

The IF block 6 is connected to the second treating block 5. The IF block 6 loads and unloads the substrate W into and from an exposure device EXP as an external device. As shown in FIGS. 1, 2, 6, and 7, the IF block 6 includes three substrate transport mechanisms HU5 to HU7, pre-exposure cleaning units 161, post-exposure cleaning units SOAK, post-exposure bake treatment units PEB, buffer units PSB4, PSB5, mounting-cum-cooling units P-CP, and a substrate platform PS9.

Note that the cleaning units 161, SOAK each include a holding rotation portion for holding the substrate W, and nozzles for dispensing, for example, the cleaning liquid to the substrate W. Moreover, the pre-exposure cleaning unit 161 may perform polishing to a back face and an edge (bevel portion) of the substrate W with use of a brush and the like. Here, the back face of the substrate W is a face opposite to the face where circuit patterns are formed, for example. The buffer units PSB4, PSB5 can each place a plurality of the substrates W thereon.

As shown in FIG. 2, the two substrate transport mechanisms HU5, HU6 are arranged side by side in the Y direction perpendicular with respect to the X direction. Moreover, the two substrate transport mechanisms HU5, HU6 are arranged across the buffer unit PSB4 that can place a plurality of the substrates W thereon. A seventh substrate transport mechanism HU7 is disposed opposite to the second treating block 5 across the two substrate transport mechanisms HU5, HU6. That is, the two substrate transport mechanisms HU5, HU6 are disposed between the seventh substrate transport mechanism HU7 and the second treating block 5. The mounting-cum-cooling units P-CP and the substrate platform PS9 are surrounded by the three substrate transport mechanisms HU5 to HU7. The mounting-cum-cooling units P-CP and the substrate platform PS9 are arranged in the up-down direction. The substrate platform PS9 is capable of placing a plurality of the substrates W thereon.

The fifth substrate transport mechanism HU5 transports the substrate W among the pre-exposure cleaning units 161 (on an arrow RS side of FIG. 2, see FIG. 6), the post-exposure cleaning units SOAK (on the arrow RS side), the post-exposure bake treatment units PEB (on the arrow RS side), the buffer units PSB4, PSB5; the mounting-cum-cooling units P-CP and the substrate platform PS9. The sixth substrate transport mechanism HU6 transports the substrate W among the pre-exposure cleaning units 161 (on an arrow LS side of FIG. 2, see FIG. 7), the post-exposure cleaning units SOAK (on the arrow LS side), the post-exposure bake treatment units PEB (on the arrow LS side), the buffer units PSB4, PSB5, the mounting-cum-cooling unit P-CP and the substrate platform PS9. The substrate transport mechanism HU7 transports the substrate W among the exposure device EXP, the mounting-cum-cooling units P-CP and the substrate platform PS9.

The three substrate transport mechanisms HU5 to HU7 each include hands 21, a forward/rearward driving unit 23, and a lifting/lowering rotation driving unit 58. The hands 21 and the forward/rearward driving unit 23 are configured in the same manner as the hands 21 and the forward/rearward driving unit 23 of the substrate transport mechanism MHU1, respectively, for example. The lifting/lowering rotation driving unit 58 includes an electric motor. The lifting/lowering rotation driving unit 58 lifts and lowers the hands 21 and the forward/rearward driving unit 23, and also rotates the hands 21 and the forward/rearward driving unit 23 around the vertical axis.

(1-4) Configuration of Carrier Buffer Device 8

As illustrated in FIGS. 1 and 3, the carrier buffer device 8 includes a carrier transport mechanism 61 and carrier storage shelves 63. The carrier transport mechanism 61 and the carrier storage shelf 63 (i.e., the carrier buffer device 8) are mounted on the ID block 2 and the two treating blocks 3, 5. The carrier transport mechanism 61 transports a carrier C between the platform 16 of each of the four openers 11 to 14 and the carrier storage shelf 63. The carrier storage shelf 63 stores the carrier C. Note that each of the carrier transport mechanism 61 and the carrier storage shelf 63 may be mounted on at least one of the ID block 2 and the two treating blocks 3 and 5. Also, each of the carrier transport mechanism 61 and the carrier storage shelf 63 may be mounted on the IF block 6.

Reference is made to FIG. 3. The carrier transport mechanism 61 includes two articulated arms 65, 66. The first articulated arm 65 includes a first end with a gripper 67, and a second articulated arm 66 includes a first end with a gripper 68. The first articulated arm 65 includes a second end supported on a strut lifting/lowering driving unit 69 so as to be movable in the up-down direction (Z direction). The second articulated arm 66 includes a second end supported on the lifting/lowering driving unit 69 so as to be movable in the up-down direction.

Each of the two grippers 67, 68 is configured to grasp a projection provided on a top face of the carrier C, for example. The lifting/lowering driving unit 69 is configured to make the two articulated arms 65, 66 to be liftable individually. The two grippers 67, 68, the two articulated arms 65, 66 and the lifting/lowering driving unit 69 each include an electric motor.

A forward/backward driving unit 70 includes a supporting portion 70A configured to support the lifting/lowering driving unit 69, a longitudinal portion 70B extending longitudinally in the forward/rearward direction (X-direction), and an electric motor. For instance, the longitudinal portion 70B may be a rail (guide rail) and the supporting portion 70A may be a carriage. In this case, the electric motor may cause the carriage (supporting portion 70A) to move along the rail (longitudinal portion 70B).

Moreover, the electric motor, the pulleys, the belt, and the guide rail may be accommodated in the longitudinal portion 70B, and the supporting portion 70A may be fixed to the belt, for example. In this case, the electric motor may cause the pulleys to rotate to move the belt on the pulleys, whereby supporting portion 70A is moved along the guide rail. Moreover, the electric motor, a screw shaft, and the guide rail may be accommodated in the longitudinal portion 70B, and a nut configured to engage with the screw shaft may be provided in the supporting portion 70A, for example. In this case, the electric motor may cause the screw shaft to rotate to move the supporting portion 70A along the guide rail.

The carrier storage shelf 63 also receives the carrier C containing untreated substrates W from the external transport mechanism OHT (Overhead Hoist Transport). Moreover, the carrier storage shelf 63 also delivers the carrier C containing treated substrates W to the external transport mechanism OHT. The external transport mechanism OHT transports a carrier C in the factory. Untreated substrates W refer to substrates W not subjected to the substrate treatment by the substrate treating apparatus 1 in this embodiment, whereas treated substrates W refer to substrates W subjected to the substrate treatment by the substrate treating apparatus 1 in this embodiment. A rail 77 for the external transport mechanism OHT is provided partially above the carrier storage shelf 63. The external transport mechanism OHT delivers the carrier C to and from the carrier storage shelf 63. The carrier transport mechanism 61 is capable of freely moving the carrier C between the platform 16 and the shelves 63.

(2) Operation of Substrate Treating Apparatus 1

Figure 9:
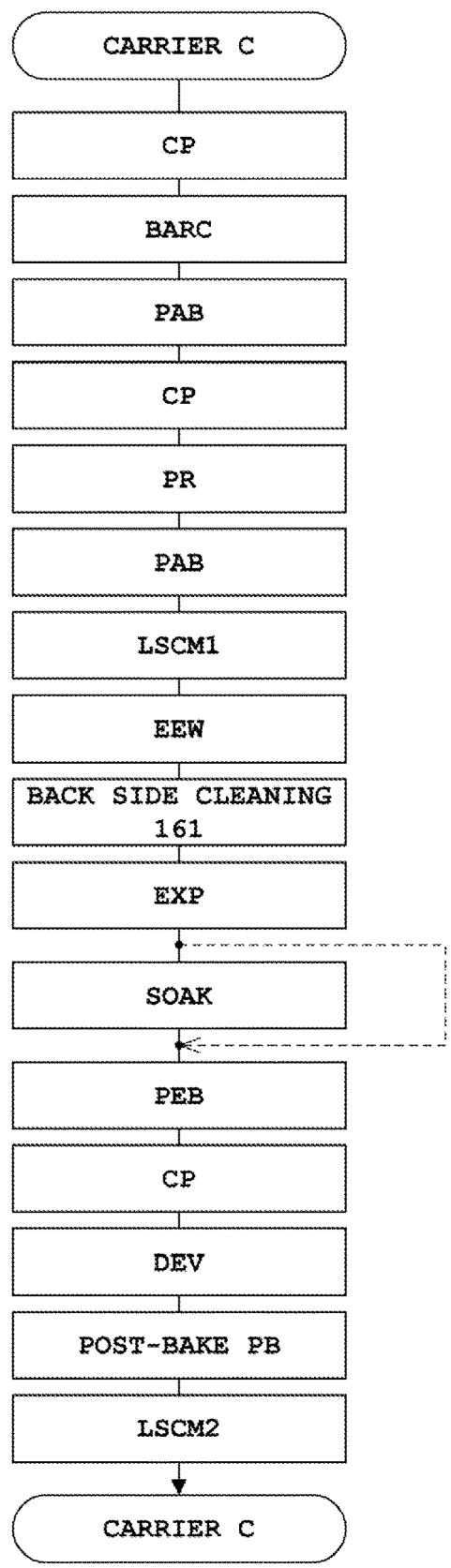
FIG. 9 is a flowchart illustrating an exemplary treatment process of the substrate treating apparatus.
Figure 10:
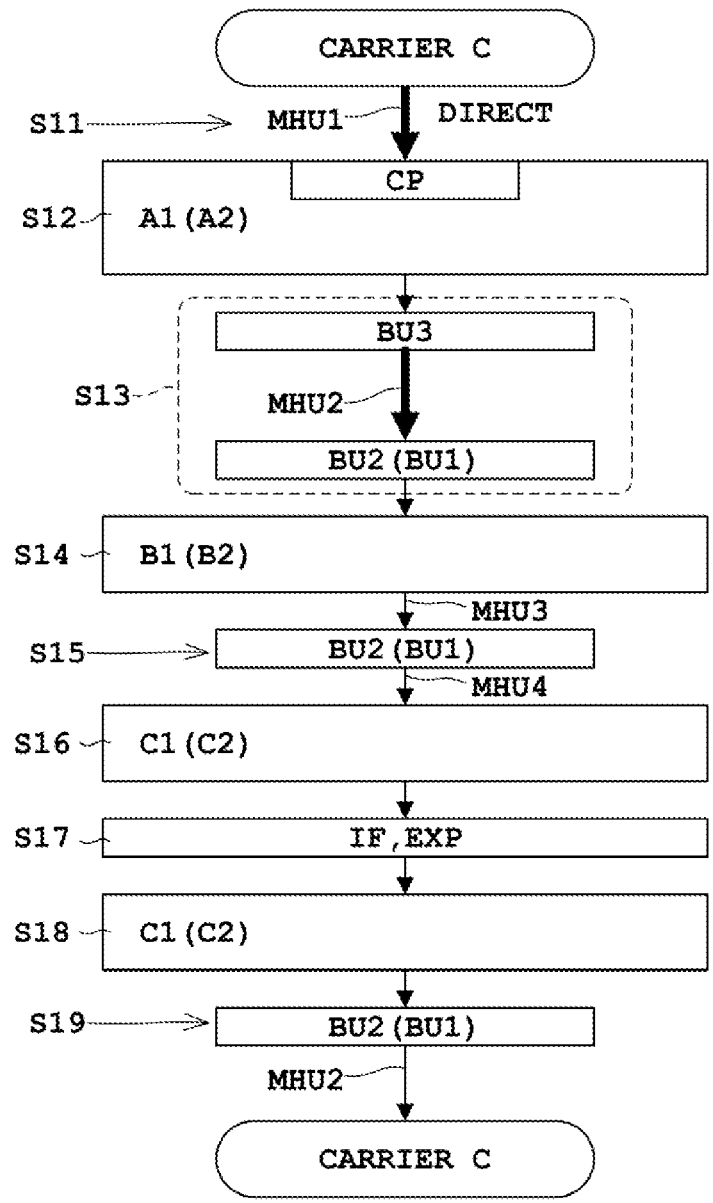
FIG. 10 is a flowchart illustrating operation of the substrate treating apparatus.

The following describes operation of the substrate treating apparatus 1. FIG. 9 is a flowchart illustrating an exemplary treatment process of the substrate treating apparatus 1. FIG. 10 is a flowchart illustrating operation of the substrate treating apparatus 1.

The carrier transport mechanism 61 shown in FIG. 3 transports the carrier C, containing the untreated substrates W transported by the external transport mechanism OHT, to one of the openers 11 and 12. In this explanation, it is assumed that the carrier C is already transported to the opener 11. The shutter member and the shutter member driving mechanism (both not shown) open the opening 18 while detaching the lid of the carrier C placed on the platform 16 of the opener 11.

[Step S11] Direct Transportation of Substrate W from Carrier C to Treatment Layer A1 (A2)

The substrate transport mechanism MHU1 of the ID block 2 directly transports the substrate W from the carrier C, placed on the platform 16 of the opener 11, to at least one of the four cooling units CP of the treatment layer A1 of the first treating block 3 without passing through the buffer unit BU3 (the substrate buffer BF). Accordingly, the substrate W taken from the carrier C is transported through the substrate inlet 59B shown in FIG. 8 to the plate 57A of the cooling unit CP. This achieves omitting of operation that the substrate transport mechanism MHU3 of the treatment layer A1 takes the substrate W from the buffer unit BU3 and transports the taken substrate W to the plates 57A of the cooling unit CP through the substrate inlet 59A. Accordingly, the load on the substrate transport mechanism MHU3 of the treatment layer A1 for substrate transportation is reduced.

Here, the substrate transport mechanism MHU1 of the ID block 2 has two hands 21. The substrate transport mechanism MHU1 uses the two hands 21 to take two substrates W from the carrier C simultaneously, and directly transports the substrates W one by one to each plates 57A of the two cooling units CP of the treatment layer A1 of the first treating block 3 without passing through the buffer unit BU3. This achieves reduction in frequency of reciprocation of the substrate transport mechanism MHU1. In addition, after the substrate transport mechanism MHU1 transports the two substrates W to the treatment layer A1, the substrate transport mechanism MHU1 directly transports two substrates W taken simultaneously from the carrier C one by one to each plates 57B of the two cooling units CP of the four cooling units CP (adjacent treating units AD) of the treatment layer A2. That is, the substrate transport mechanism MHU1 transports two substrates W taken from the carrier C alternately to the two treatment layers A1, A2. It should be noted that one of the two substrates W taken simultaneously may be transported to the cooling unit CP of the treatment layer A1 and the other to the cooling unit CP of the treatment layer A2.

Moreover, after all the substrates W are taken from the carrier C, the empty carrier C is transported to one of the two openers 13 and 14 (e.g., opener 13).

[Step S12] Forming Antireflection Film by Treatment Layer A1 (A2)

The treatment layer A1 forms an antireflection film on the substrate W transported from the carrier C. Detailed description is as under. The substrate W transported directly by the substrate transport mechanism MHU1 is cooled by the cooling unit CP. The substrate transport mechanism MHU3 of the treatment layer A1 takes the substrate W from the cooling unit CP and transports the taken substrate W in the order of the coating unit BARC, the heating unit PAB, and the buffer unit BU3. The coating unit BARC forms the antireflection film on the substrate W. The same treatment is performed in the treatment layer A2 as in the treatment layer A1.

[Step S13] Substrate Transportation Between Two Treatment Layers Positioned at Different Height Positions The substrate transport mechanism MHU 3 transports the substrate W, on which the antireflection film is formed, to the buffer unit BU3. The substrate transport mechanism MHU2 of the ID block 2 transports the substrate W from the buffer unit BU3 to the buffer unit BU2. That is, when transporting a substrate W between two treatment layers A1, B1 disposed at different height positions, the substrate transport mechanism MHU2 transports the substrate W between the two buffer units BU3, BU2 disposed at height positions corresponding to height positions of the treatment layers A1, B1. Thereafter, the substrate transport mechanism MHU3 of the treatment layer B1 takes the substrate W from the buffer unit BU2. When the substrate W is transported between the two treatment layers A2, B2 disposed at different height positions, the substrate transport mechanism MHU2 transports the substrate W from the buffer unit BU3 to the buffer unit BU1. With such operation, it is possible to transport the substrate W to the treatment layers B1, B2 (first floor and second floor) whose stages differ from the stage (third floor) of treatment layers A1, A2. Moreover, the substrate transport mechanism MHU1 may transport the substrate from the buffer unit BU3 to the buffer unit BU2 (BU1).

[Step S14] Forming Photoresist Film by Treatment Layer B1 (B2)

The treatment layer B1 forms a photoresist film on the substrate W transported from the treatment layer A1 whose height position is different from that of the treatment layer B1. That is, the substrate transport mechanism MHU3 of the treatment layer B1 transports the substrate W, taken from the buffer unit BU2, in the order of the cooling unit CP, the coating unit PR, and the heating unit PAB. The coating unit PR forms the photoresist film on the substrate W (i.e., on the antireflection film). The same treatment is performed in the treatment layer B2 as in the treatment layer B1.

[Step S15] Substrate Transportation Between Two Treatment Layers at the Same the Height Position Thereafter, the substrate transport mechanism MHU3 of the treatment layer B1 transports the substrate W, on which the photo-resist film is formed, to the buffer unit BU2. The treatment layer C1 is on the same the height position (second floor) as the treatment layer B1. The substrate transport mechanism MHU4 of the treatment layer C1 receives the substrate W, transported by the substrate transport mechanism MHU3 of the treatment layer B1, from the buffer unit BU2. That is, when transporting a substrate W between the two treatment layers B1, C1 in the same the height position, the substrate transport mechanisms MHU3, MHU4 in the respective treatment layers B1, C1 each deliver the substrate W through the buffer unit BU2. The substrate transportation from the treatment layer B1 to the treatment layer C1 is performed without using the two substrate transport mechanisms MHU1, MHU2 of the ID block 2. Accordingly, the load on the substrate transport mechanisms MHU1, MHU2 for transporting the substrates can be reduced.

Likewise, the substrate transport mechanism MHU3 of the treatment layer B2 transports the substrate W to the buffer unit BU1. Thereafter, the substrate transport mechanism MHU4 of the treatment layer C2 receives the substrate W, transported by the substrate transport mechanism MHU3 of the treatment layer B2, from the buffer unit BU1.

[Step S16] Substrate Transportation by Treatment Layer C1 (C2)

The substrate transport mechanism MHU4 of the treatment layer C1 transports the substrate W received from the buffer unit BU2 in the order of the inspection unit LSCM1, the edge exposing unit EEW, and the buffer unit PSB4. Likewise, the substrate transport mechanism MHU4 of the treatment layer C2 transports the substrate W received from the buffer unit BU1 in the order of the inspection unit LSCM1, the edge exposing unit EEW, and the buffer unit PSB5. The inspection unit LSCM1 inspects and measures a photoresist film (coated film).

[Step S17] Substrate Transportation by IF Block 6

The IF block 6 unloads the substrate W, transported by the treatment layer C1 (C2), to the exposure device EXP. Moreover, the IF block 6 loads the substrate W, subjected to the exposure treatment by the exposure device EXP, into the IF block 6.

The two substrate transport mechanisms HU5, HU6 each receive the substrate W from buffer unit PSB4 (PSB5). The two substrate transport mechanisms HU5, HU6 each transport the received substrate W in the order of the pre-exposure cleaning unit 161 (see FIGS. 6 and 7) and the mounting-cum-cooling unit P-CP (see FIG. 1). The substrate transport mechanism HU7 receives the substrate W from the mounting-cum-cooling unit P-CP, and unloads the received the substrate W to the exposure device EXP. The exposure device EXP performs the exposure treatment on the unloaded substrate W. The substrate transport mechanism HU7 of the IF block 6 loads the substrate W, treated by the exposure device EXP, into the IF block 6, and transports the loaded substrate W to the substrate platform PS9. Thereafter, the two substrate transport mechanisms HU5, HU6 each receive the substrate W from the substrate platform PS9. The two substrate transport mechanisms HU5, HU6 each transport the received substrate W in the order of the post-exposure cleaning unit SOAK, the post-exposure bake treatment unit PEB, and the buffer unit PSB4 (PSB5).

The substrate W, transported from the treatment layer C1, is returned to the treatment layer C1. The substrate W transported from the treatment layer C2 is returned to the treatment layer C2.

[Step S18] Developing Treatment by Treatment Layer C1 (C2)

The substrate transport mechanism MHU4 of the treatment layer C1 receives the substrate W from the buffer unit PSB4, and transports the received substrate W in the order of the cooling unit CP, the developing unit DEV, the post-bake unit PB, the inspection unit LSCM2, and the buffer unit BU2. The developing unit DEV performs the developing treatment on the substrate W subjected to the exposure treatment by the exposure device EXP. The inspection unit LSCM2 inspects the substrate W subjected to the developing treatment.

The same treatment is performed in the treatment layer C2 as in the treatment layer C1. In the treatment layer C2, the developed substrate W is finally transported to the buffer unit BU1. Moreover, in step S17, the treatment by post-exposure bake treatment unit PEB is performed. Alternatively, the baking treatment after the exposure may be performed in this step.

[Step S19] Substrate Transportation from Treatment Layer C1 (C2) to Carrier C

The substrate transport mechanism MHU2 of the ID block 2 takes the substrate W from the buffer unit BU2 (BU1), and transports the taken substrate W to the carrier C placed on the platform 16 of one of the two openers 13 and 14 (e.g., opener 13). The substrate transport mechanism MHU2 alternately takes the substrate W from the two buffer units BU1 and BU2, and transports the taken substrate W to the carrier C placed on the platform 16. When all substrates W are returned to the carrier C, the shutter member and the shutter member driving mechanism close the opening 18 while attaching the lid to the carrier C. Thereafter, for delivery to the external transport mechanism OHT, the carrier transport mechanism 61 transports the carrier C, containing the treated substrate W, from the opener 13.

According to this embodiment, the footprint of the substrate treating apparatus 1 is suppressible. Detailed description is as under. The substrate transport mechanism MHU2 (MHU1) of the ID block 2 can take the substrate W into and out of the carrier C placed on the platform 16. Moreover, the substrate transport mechanism MHU2 (MHU1) transports the substrate W between the two treatment layers A1, B1 at different height positions in the first treating block 3 and the second treating block 5, for example. Accordingly, any delivery block configured to move the substrates between two treatment layers in the up-down direction does not need to be provided between the indexer block and the treating block as in the prior art. As a result, the footprint of the substrate treating apparatus 1 is suppressible.

Moreover, when a substrate W is transported across the ID block 2 between the two treatment layers B1, C1 at the equal height position, for example, the substrate W can be delivered not using the two substrate transport mechanisms MHU1, MHU2 but using the substrate buffer BF. Moreover, when a substrate W is transported between the two treatment layers A1, B1 at different height positions, for example, the substrate W can be delivered using, for example, the first substrate transport mechanism MHU1 and the substrate buffer BF. Here, when the substrate W can be transported without using the two substrate transport mechanisms MHU1, MHU2, the load on the two substrate transport mechanisms MHU1, MHU2 can be reduced.

In this embodiment, the ID block 2 includes the two substrate transport mechanisms MHU1, MHU2. In this regard, in FIG. 2, the ID block 2 may include only the first substrate transport mechanism MHU1 disposed adjacent to the heat treating unit 37. In step S19 of the flow chart shown in FIG. 10, the second substrate transport mechanism MHU2 transports the substrate W through the buffer unit BU2, for example, when transporting the substrate W from the treatment layer C1 to the carrier C placed on the platform 16. This may be configured as follows. For example, the inspection unit LSCM2 of the treatment layer C1 may be configured to be able to take the substrate W in and out in two directions (see FIG. 8) as the adjacent treating unit AD. Moreover, the substrate transport mechanism MHU1 of the ID block 2 may directly transport the substrate W from the inspection unit LSCM2 of the treatment layer C1 to the carrier C.

The ID block 2 includes the two substrate transport mechanisms MHU1, MHU2. Alternatively, the substrate may typically be transported by only the first substrate transport mechanism MHU1. In an emergency, the substrate may be transported by only the second substrate transport mechanism MHU2 or by cooperation of the two substrate transport mechanisms MHU1, MHU2.

SECOND EMBODIMENT

Figure 11:
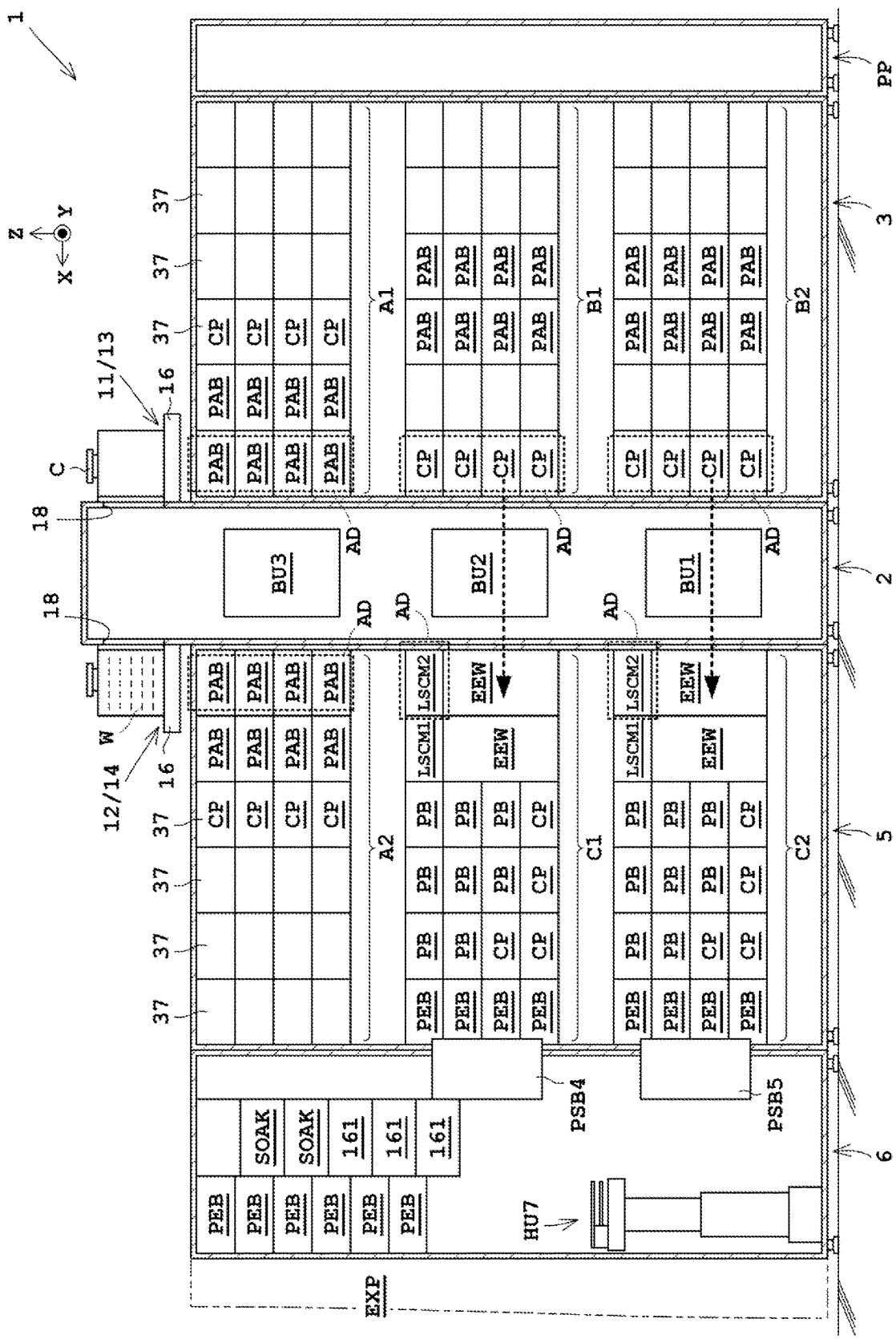
FIG. 11 is a left side view of a substrate treating apparatus according to a second embodiment.
Figure 12:
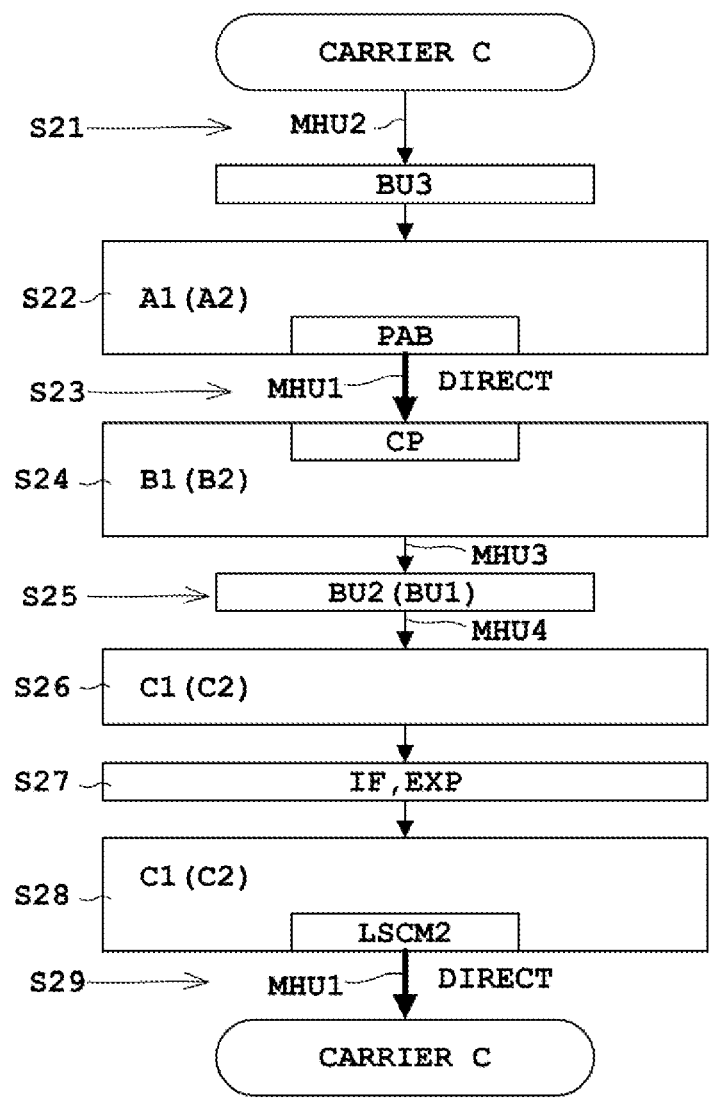
FIG. 12 is a flowchart illustrating operation of the substrate treating apparatus according to the second embodiment.

A second embodiment of the present invention will now be described with reference to the drawings. Here, the description common to that of the first embodiment is to be omitted. FIG. 11 is a left side view of a substrate treating apparatus 1 according to the second embodiment. FIG. 12 is a flowchart illustrating operation of the substrate treating apparatus according to the second embodiment.

The following in the second embodiment describes operation different from that in the first embodiment. In FIG. 11, each of the two treatment layers A1, A2 includes four heating units PAB as the adjacent treating units AD that are adjacent to the ID block 2. In addition, each of the two treatment layers B1, B2 includes four cooling units CP as the adjacent treating units AD. Moreover, each of the two treatment layers C1, C2 includes one inspection unit LSCM2 as the adjacent treating unit AD. Here, the liquid treating units 36 are arranged as FIG. 6 of the first embodiment with respect to the heat treating unit 37 in FIG. 11. As described above, the adjacent treating units AD are each provided with the two substrate inlets 59A and 59B for taking the substrate W in and out in two directions (see FIG. 8).

In the first embodiment, the substrate transport mechanism MHU1 takes the substrate W from the carrier C, and the substrate transport mechanism MHU2 accommodates the substrate W into the carrier C. In this regard, operation in the second embodiment is performed in a reverse manner. That is, the substrate transport mechanism MHU2 takes the substrate W from the carrier C, and the substrate transport mechanism MHU1 accommodates the substrate W into the carrier C. Moreover, the substrate transport mechanism MHU1 may be configured to take the substrate W from the carrier C.

[Step S21] Substrate transportation from Carrier C to Treatment Layer A1 (A2)

The carrier C is placed on the platform 16 of the opener 13, for example. The substrate transport mechanism MHU2 of the ID block 2 takes the substrate W from the carrier C placed on the platform 16 of the opener 13, and transports the taken substrate W to the buffer unit BU3.

[Step S22] Forming Antireflection Film by Treatment Layer A1 (A2)

The treatment layer A1 forms an antireflection film on the substrate W transported from the carrier C. The substrate transport mechanism MHU3 of the treatment layer A1 receives the substrate W from the buffer unit BU3, and transports the received substrate W in the order of the cooling unit CP, the coating unit BARC, and the heating unit PAB. The coating unit BARC forms an antireflection film on the substrate W. The same treatment is performed in the treatment layer A2 as in the treatment layer A1.

[Step S23] Direct Transportation of Substrate W Between Two Treatment Layers Positioned at Different Height Positions When transporting the substrate W between the two treatment layers A1, B1 at the different height positions, for example, the first substrate transport mechanism MHU1 directly transports the substrate W between the heating unit PAB of the treatment layer A1 and the cooling unit CP of the treatment layer B1 (between two treating units) without passing through the buffer units BU3, BU2. That is, the first substrate transport mechanism MHU1 directly transports the substrate W from the heating unit PAB of the treatment layer A1 to the cooling unit CP of the treatment layer B1. Thus, the substrate transport mechanism MHU3 of the treatment layer A1 can omit operation of taking the substrate W from the heating unit PAB and transporting the taken substrate W to the buffer unit BU3. In addition, the substrate transport mechanism MHU3 of the treatment layer B1 can omit operation of taking the substrate W from the buffer unit BU2 and transporting the taken substrate W to the cooling unit CP. Accordingly, the load on the substrate transport mechanism MHU3 of the two treatment layers A1, B1 can be reduced.

When transporting the substrate W between the two treatment layers A2, B2 at different height positions, the substrate transport mechanism MHU1 directly transports the substrate W from the heating unit PAB of the treatment layer A2 to the cooling unit CP of the treatment layer B2 without passing through the buffer units BU3, BU1.

[Step S24] Forming Photoresist Film by Treatment Layer B1 (B2)

The treatment layer B1 forms a photoresist film on the substrate W transported from the treatment layer A1 whose height position is different from that of the treatment layer B1. Detailed description is as under. The substrate W transported directly by the substrate transport mechanism MHU1 is cooled by the cooling unit CP. The substrate transport mechanism MHU3 of the treatment layer B1 transports the substrate W taken from the cooling unit CP in the order of the coating unit PR and the heating unit PAB. The coating unit PR forms the photoresist film on the substrate W (i.e., on the antireflection film). The same treatment is performed in the treatment layer B2 as in the treatment layer B1.

[Step S25] Substrate Transportation Between Two Treatment Layers at Same Height Position Thereafter, the substrate transport mechanism MHU3 of the treatment layer B1 transports the substrate W, on which the photo-resist film is formed, to the buffer unit BU2. The substrate transport mechanism MHU4 of the treatment layer C1 receives the substrate W, transported by the substrate transport mechanism MHU3 of the treatment layer B1, from the buffer unit BU2. The substrate transportation from the treatment layer B1 to the treatment layer C1 is performed without using the two substrate transport mechanisms MHU1, MHU2 of the ID block 2. Accordingly, the load on the substrate transport mechanisms MHU1, MHU2 for transporting the substrates can be reduced.

Likewise, the substrate transport mechanism MHU3 of the treatment layer B2 transports the substrate W to the buffer unit BU1. Thereafter, the substrate transport mechanism MHU4 of the treatment layer C2 receives the substrate W, transported by the substrate transport mechanism MHU3 of the treatment layer B2, from the buffer unit BU1.

[Step S26] Substrate Transportation by Treatment Layer C1 (C2)

The substrate transport mechanism MHU4 of the treatment layer C1 transports the substrate W, received from the buffer unit BU2, in the order of the inspection unit LSCM1, the edge exposing unit EEW, and the buffer unit PSB4. Likewise, the substrate transport mechanism MHU4 of the treatment layer C2 transports the substrate W received from the buffer unit BU1 in the order of the inspection unit LSCM1, the edge exposing unit EEW, and the buffer unit PSB5. The inspection unit LSCM1 inspects and measures a photoresist film (coated film).

[Step S27] Substrate Transportation by IF Block 6

The IF block 6 unloads the substrate W, transported by the treatment layer C1 (C2), to the exposure device EXP. Moreover, the IF block 6 loads the substrate W, subjected to the exposure treatment by the exposure device EXP, into the IF block 6.

The substrate W, subjected to the exposure treatment, is transported to the buffer unit PSB4 for transportation to the treatment layer C1. Moreover, the substrate W, subjected to the exposure treatment, is transported to the buffer unit PSB5 for transportation to the treatment layer C2. The substrate W, transported from the treatment layer C1, is returned to the treatment layer C1. The substrate W, transported from the treatment layer C2, is returned to the treatment layer C2.

[Step S28] Developing Treatment by Treatment Layer C1 (C2)

The substrate transport mechanism MHU4 of the treatment layer C1 receives the substrate W from the buffer unit PSB4, and transports the received substrate W in the order of the cooling unit CP, the developing unit DEV, the post-bake unit PB, and the inspection unit LSCM2. The developing unit DEV performs the developing treatment on the substrate W subjected to the exposure treatment by the exposure device EXP. The inspection unit LSCM2 inspects the substrate W subjected to the developing treatment. The same treatment is performed in the treatment layer C2 as in the treatment layer C1.

[Step S29] Direct Transportation of Substrate W from Treatment Layer C1 (C2) to the carrier C The substrate transport mechanism MHU1 of the ID block 2 directly transports (directly accommodates) the substrate W from the inspection unit LSCM2 of the treatment layer C1 (C2) of the second treating block 5 to the carrier C placed on the platform 16 of one of the two openers 11 and 12 (for example, opener 11) without passing through the buffer unit BU2 (BU1). Thus, the substrate transport mechanism MHU4 of the treatment layer C1 (C2) can omit operation of taking the substrate W from the inspection unit LSCM2 and transporting the taken substrate W to the buffer unit BU2 (BU1).

The substrate transport mechanism MHU1 takes the substrate one by one from the two inspection units LSCM2 of the two treatment layers C1, C2 of at least either the first treating block 3 or the second treating block 5 (e.g., the second treating block 5). Thereafter, the substrate transport mechanism MHU1 directly transports the taken two substrates W simultaneously to the carrier C placed on the platform 16 without passing through the buffer units BU1 and BU2. This achieves reduction in frequency of reciprocation of the substrate transport mechanism MHU1. Accordingly, enhanced transportation efficiency of the substrate W can be achieved.

According to this embodiment, the footprint of the substrate treating apparatus 1 is suppressible in the same manner as in the first embodiment.

THIRD EMBODIMENT

Figure 13:
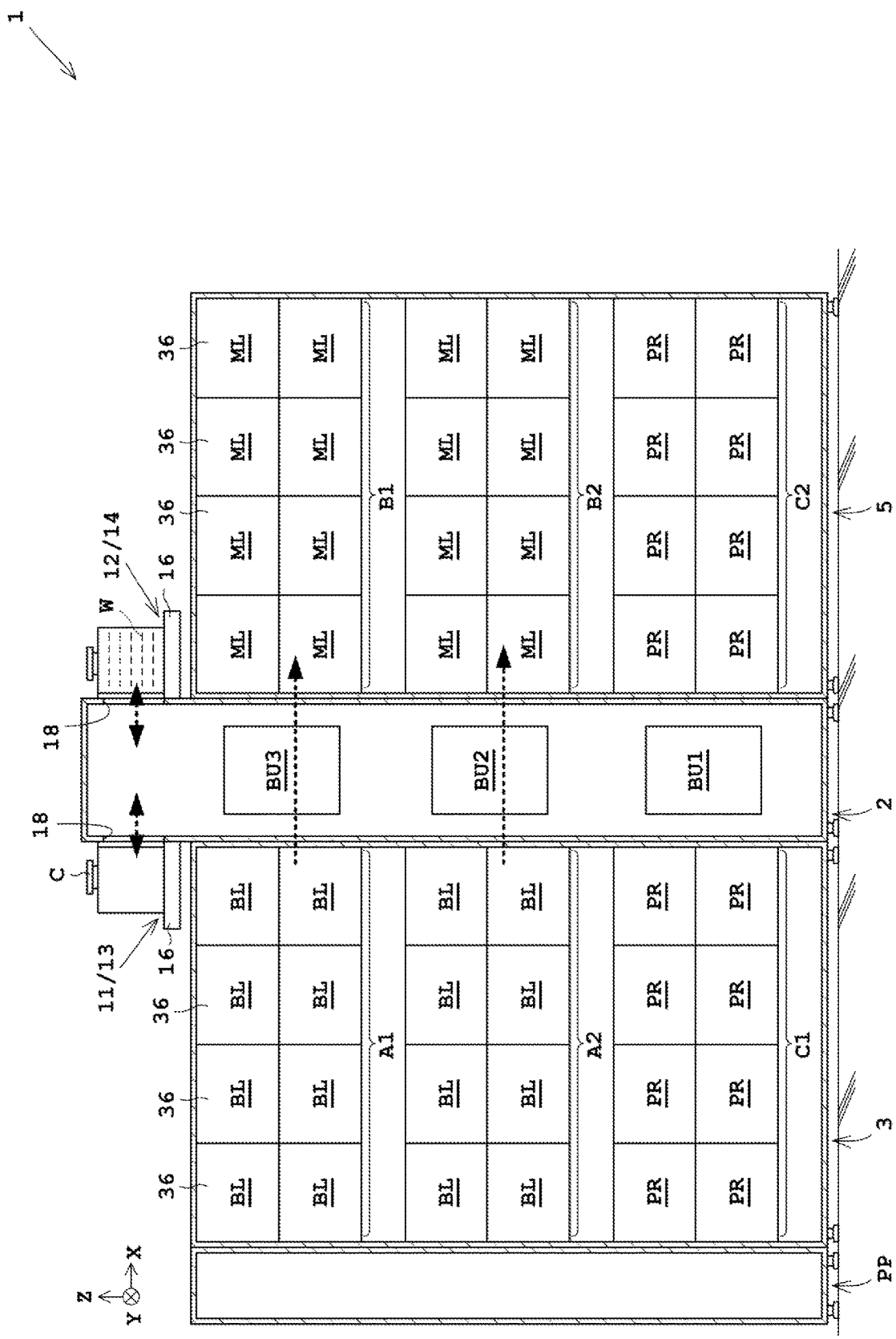
FIG. 13 is a right side view of a substrate treating apparatus according to a third embodiment.
Figure 14:
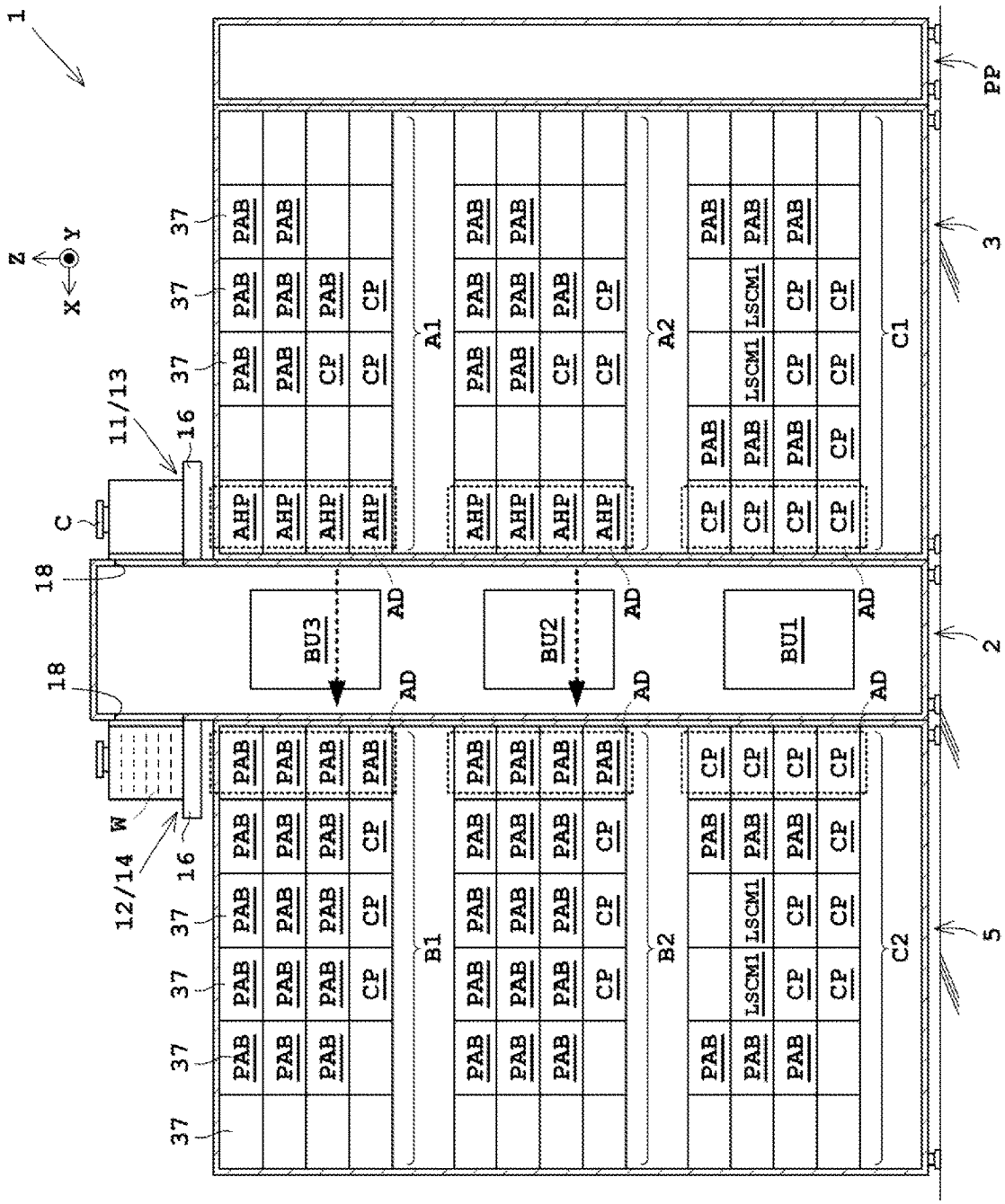
FIG. 14 is a left side view of a substrate treating apparatus according to the third embodiment.

A third embodiment of the present invention will now be described with reference to the drawings. Here, the description common to that of Embodiments 1 and 2 is to be omitted. FIG. 13 is a right side view of a substrate treating apparatus 1 according to a third embodiment. FIG. 14 is a left side view of a substrate treating apparatus 1 according to the third embodiment.

In the first and second embodiments, the substrate treating apparatus 1 includes the IF block 6. In this regard, in the third embodiment, the substrate treating apparatus 1 does not include the IF block 6. Here in this embodiment, the first treating block 3 corresponds to the first treating device in the present invention. The second treating block 5 corresponds to the second treating device in the present invention.

Reference is made to FIG. 13. The first treating block 3 includes three treatment layers C1, A2, A1. On the other hand, the second treating block 5 includes three treatment layers C2, B2, B1. Each of the two treatment layers A1, A2 forms an underlayer film (e.g., a spin on carbon (SOC) film) on the substrate W. Each of two treatment layers B1, B2 forms a middle film (e.g., spin on glass (SOG) film) on the substrate W. The two treatment layers C1, C2 form a photo-resist film on the substrate W.

Accordingly, as shown in FIG. 13, the two treatment layers A1, A2 each include eight coating units BL. The two treatment layers B1, B2 each include eight coating units ML. The two treatment layers C1, C2 each include eight coating units PR.

Reference is next made to FIG. 14. The two treatment layers A1, A2 each include four adhesion enhancing treatment units AHP, three cooling units CP, and seven heating units PAB. The two treatment layers B1, B2 each include sixteen heating units PAB and three cooling units CP. The two treatment layers C1, C2 each include six heating units PAB, nine cooling units CP, and two inspection units LSCM1. Here, the adhesion enhancing treatment units AHP apply an adhesion enhancing agent, such as hexamethyldisilazane (HMDS), to substrates W and heat the substrates W.

Here, in the two treatment layers A1, A2, the four adhesion enhancing treatment units AHP are arranged as the adjacent treating units AD. In the two treatment layers B1, B2, the four heating units PAB are arranged as the adjacent treating units AD. Moreover, in the two treatment layers C1, C2, the four cooling units CP are arranged as the adjacent treating units AD.

(2) Operation of Substrate Treating Apparatus 1

Figure 15:
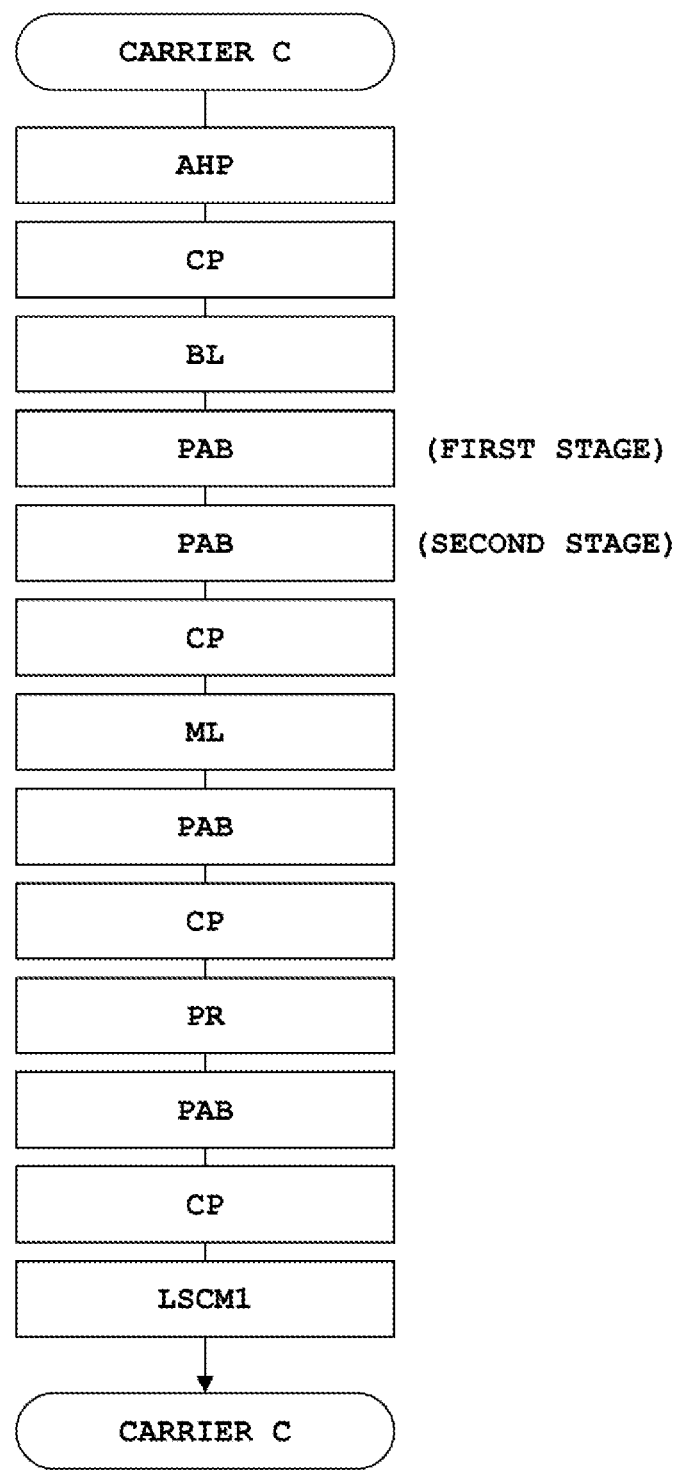
FIG. 15 is a flowchart illustrating an exemplary treatment process of the substrate treating apparatus.
Figure 16:
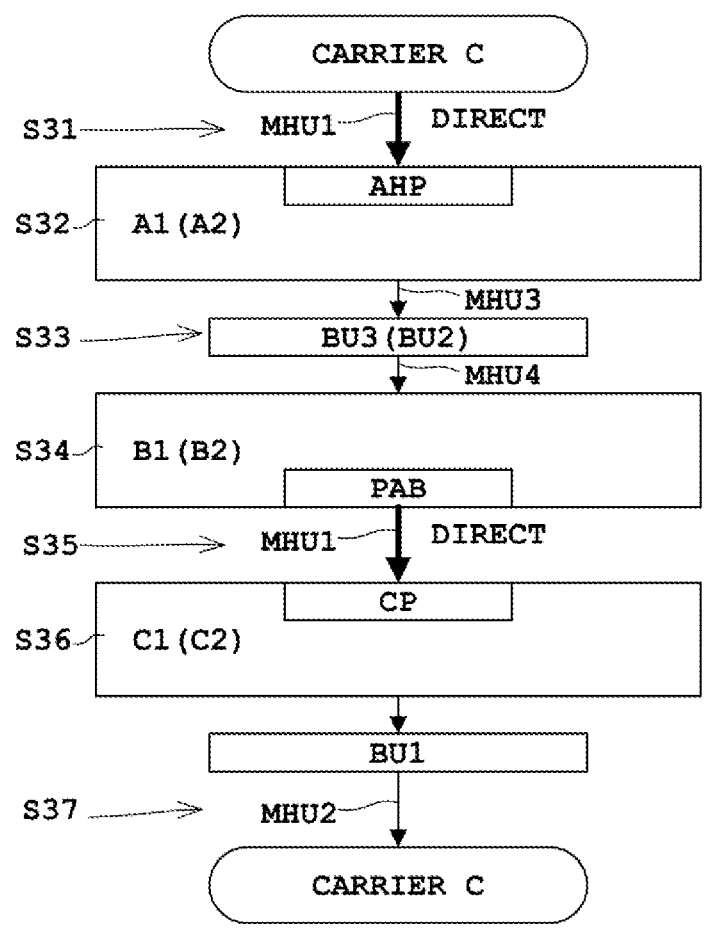
FIG. 16 is a flowchart illustrating operation of the substrate treating apparatus according to the third embodiment.

The following describes operation of the substrate treating apparatus 1. FIG. 15 is a flowchart illustrating an exemplary treatment process of the substrate treating apparatus 1. FIG. 16 is a flowchart illustrating operation of the substrate treating apparatus according to the third embodiment.

[Step S31] Direct Transportation of Substrate W from Carrier C to Treatment Layer A1 (A2)

The carrier C is placed on the platform 16 of either the two opener 11 or 12 (e.g., opener 11). The substrate transport mechanism MHU1 of the ID block 2 directly transports the substrate W from the carrier C, placed on the platform 16 of the opener 11, to at least one of the four adhesion enhancing treatment units AHP of the treatment layer A1 (A2) of the first treating block 3 without passing through the buffer unit BU3 (BU2). The substrate is alternately transported to the two treatment layers A1, A2.

[Step S32] Forming Underlayer film by Treatment Layer A1 (A2)

The two treatment layers A1, A2 each form an underlayer film on the substrate W transported from the carrier C. Detailed description is as under. The adhesion enhancing treatment unit AHP performs an adhesion enhancement treatment on the substrate W directly transported by the substrate transport mechanism MHU1. The substrate transport mechanism MHU3 of the treatment layer A1 takes the substrate W from the adhesion enhancing treatment unit AHP, and transports the taken substrate W in the order of the cooling unit CP, the coating unit BL, and the heating unit PAB (first stage). Here, the coating unit BL forms the underlayer film on the substrate W. The same treatment is performed in the treatment layer A2 as in the treatment layer A1.

[Step S33] Substrate Transportation Between Two Treatment Layers at Same Height Position Thereafter, the substrate transport mechanism MHU3 of the treatment layer A1 transports the substrate W, on which the underlayer film is formed, to the buffer unit BU3. The treatment layer B1 is on the same height position (third floor) as the treatment layer A1. The substrate transport mechanism MHU4 of the treatment layer B1 receives the substrate W, transported by the substrate transport mechanism MHU3 of the treatment layer A1, from the buffer unit BU3. That is, when the substrate W is transported between two treatment layers A1, B1 in the same height position, the substrate transport mechanisms MHU3, MHU4 in the respective treatment layers A1, B1 each deliver the substrate W through the buffer unit BU3. The substrate transportation from the treatment layer A1 to the treatment layer B1 is performed without using the two substrate transport mechanisms MHU1, MHU2 of the ID block 2. Accordingly, the load on the substrate transport mechanisms MHU1, MHU2 for transporting the substrates can be reduced.

Likewise, the substrate transport mechanism MHU3 of the treatment layer A2 transports the substrate W to the buffer unit BU2. Thereafter, the substrate transport mechanism MHU4 of the treatment layer B2 receives the substrate W transported by the substrate transport mechanism MHU3 of the treatment layer A2 from the buffer unit BU2.

[Step S34] Forming Middle Film by Treatment Layer B1 (B2)

The two treatment layers B1, B2 each form the middle film on the transported substrate W without using the two substrate transport mechanisms MHU1, MHU2. Detailed description is as under. The substrate transport mechanism MHU4 of the treatment layer B1 takes the substrate W from the buffer unit BU3, and transports the taken substrate W in the order of the heating unit PAB (second stage), the cooling unit CP, the coating unit ML, and heating unit PAB. Here, the coating unit ML forms the middle film on the substrate W (i.e., on the underlayer film) In addition, the treatment by the heating unit PAB of the second stage is performed at a higher temperature than the treatment by the heating unit PAB of the first stage. The same treatment is performed in the treatment layer B2 as in the treatment layer B1.

[Step S35] Direct Transportation of Substrate W Between Two Treatment Layers Positioned at Different Height Positions For example, when transporting the substrate W between the two treatment layers B1, C1 at the different height positions, the first substrate transport mechanism MHU1 directly transports the substrate W between the heating unit PAB of the treatment layer B1 and the cooling unit CP of the treatment layer C1 (between two treating units) without passing through the buffer units BU3 and BU1. That is, the first substrate transport mechanism MHU1 directly transports the substrate W from the heating unit PAB (adjacent treating unit AD) of the treatment layer B1 to the cooling unit CP (adjacent treating unit AD) of the treatment layer C1. Thus, the substrate transport mechanism MHU4 of the treatment layer B1 can omit operation of taking the substrate W from the heating unit PAB and transporting the taken substrate W to the buffer unit BU3. In addition, the substrate transport mechanism MHU3 of the treatment layer C1 can omit operation of taking the substrate W from the buffer unit BU1 and transporting the taken substrate W to the cooling unit CP. Accordingly, the load on the two substrate transport mechanisms MHU3, MHU4 of the two treatment layers B1, C1 can be reduced.

When transporting the substrate W between the two treatment layers B2, C2 at different height positions, the substrate transport mechanism MHU1 directly transports the substrate W from the heating unit PAB (adjacent treating unit AD) of the treatment layer B2 to the cooling unit CP (adjacent treating unit AD) of the treatment layer C2 without passing through the buffer units BU2 and BU1.

[Step S36] Forming Photoresist Film by Treatment Layer C1 (C2)

The two treatment layers C1, C2 each form the photoresist film on the transported substrate W. Detailed description is as under. The cooling unit CP cools the substrate W transported directly by the substrate transport mechanism MHU1. The substrate transport mechanism MHU3 (MHU4) of the treatment layer C1 (C2) takes the substrate W from the cooling unit CP, and transports the taken substrate W in the order of the coating unit PR, the heating unit PAB, the cooling unit CP, the inspection unit LSCM1, and the buffer unit BU1. Here, the coating unit PR forms the photoresist film on the substrate W (i.e., on the middle film).

[Step S37] Substrate Transportation from Treatment Layer C1 (C2) to Carrier C

The substrate transport mechanism MHU2 of the ID block 2 takes the substrate W from the buffer unit BU1, and accommodates the taken substrate W into the carrier C placed on the platform 16 of one of the two openers 13 and 14 (e.g., opener 13). The substrate transport mechanism MHU2 alternately accommodates the substrate W transported from the treatment layer C1 to the buffer unit BU1 and the substrate W transported from the treatment layer C2 to the buffer unit BU1 into the carrier C.

According to this embodiment, the footprint of the substrate treating apparatus 1 is suppressible in the same manner as in the first embodiment.

This invention is not limited to the foregoing examples, but may be modified as follows.

Figure 17A:
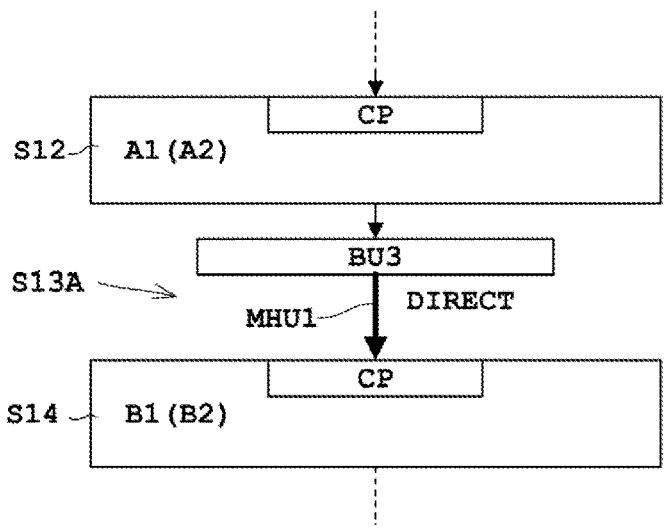
FIGS. 17A and 17B are diagrams illustrating operation according to one modification.

(1) In step S13 of the first embodiment described above (see FIG. 10), the second substrate transport mechanism MHU2 transports the substrate W from the buffer unit BU3 to either the two buffer unit BU1 or BU2. In this regard, as shown in FIG. 17 A, the first substrate transport mechanism MHU1 may directly transport the substrate W from the buffer unit BU3 to the cooling unit CP as the adjacent treating unit AD. Accordingly, in the treatment layer B1 in which the cooling unit CP is provided in the adjacent treating unit AD, the substrate transport mechanism MHU3 can omit operation of taking the substrate W from the buffer unit BU3 and transporting the taken substrate W to the cooling unit CP.

Figure 17B:
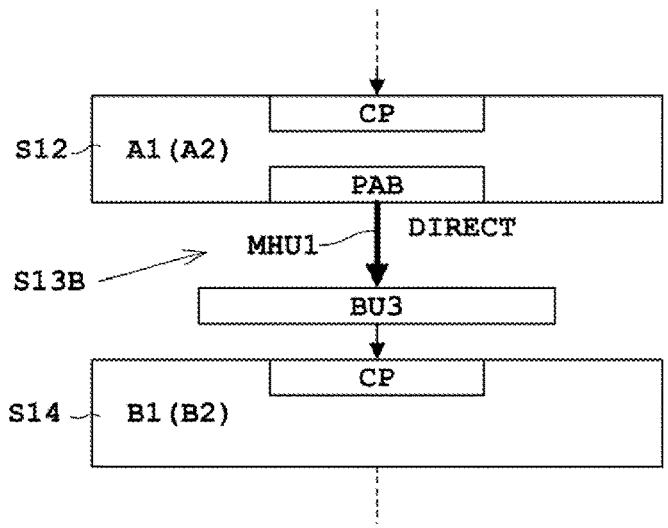

Further, it may be configured as shown in FIG. 17B. The two treatment layers A1, A2 shown in FIG. 7 each include the four cooling units CP as the adjacent treating units AD. The two cooling units CP of the four cooling units CP may be replaced by two heating units PAB. In this case, the first substrate transport mechanism MHU1 may directly transport the substrate W from the heating unit PAB of the treatment layer A1 to the buffer unit BU3, for example. Thus, the substrate transport mechanism MHU3 of each of the two treatment layers A1, A2 can omit operation of taking the substrate W from the heating unit PAB and transporting the taken substrate W to the buffer unit BU3.

Figure 18:
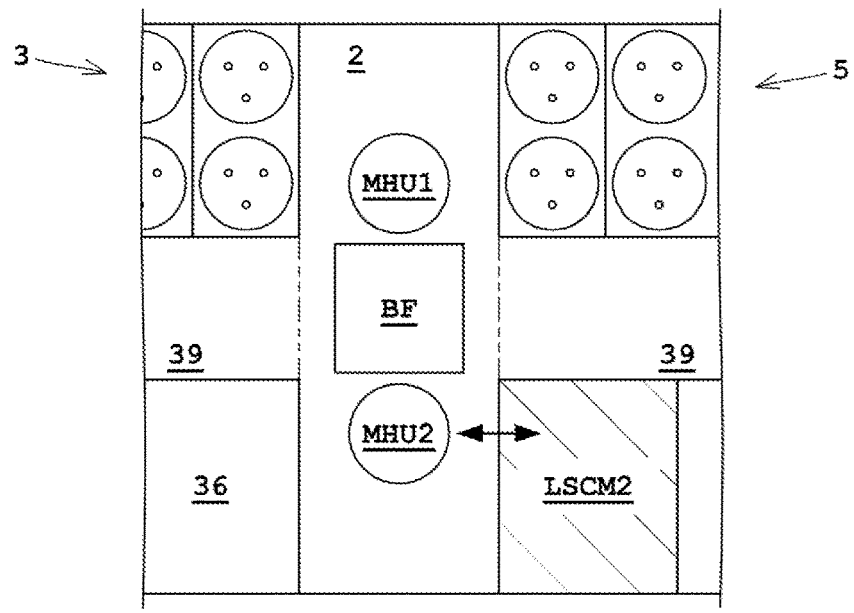
FIG. 18 is a diagram of a configuration according to the modification.

(2) In the step S19 of the first embodiment described above, the second substrate transport mechanism MHU2 transports the substrate W from the treatment layer C1 to the carrier C placed on the platform 16 through the buffer unit BU2, for example. In this regard, the second substrate transport mechanism MHU2 of the ID block 2 may be configured to directly transport the substrate W to the carrier C. Reference is made to FIG. 18. The inspection unit LSCM2 may be arranged instead of one developing unit DEV. This inspection unit LSCM2 corresponds to the adjacent treating unit AD. Thus, the substrate transport mechanism MHU4 of the treatment layer C1 can omit operation of taking the substrate W from the inspection unit LSCM2 and transporting the taken substrate W to the buffer unit BU2. Accordingly, the load on the substrate transport mechanisms of the treatment layers for substrate transportation can be reduced. In addition, when the inspection unit LSCM2 is disposed in the area of the heat treating unit 37, the first substrate transport mechanism MHU1 serves as direct transportation of the substrate W as in step S29 of FIG. 12. According to the present modification, the second substrate transport mechanism MHU2 can also transport the substrate W directly, and availability of the two substrate transport mechanisms MHU1, MHU2 can be balanced.

Moreover, the following configuration may be adopted in order for the second substrate transport mechanism MHU2 to directly transport the substrate W to at least one of adjacent treating units AD of each treatment layers. In the two treating block 3 and 5, the heat treating units 37 are disposed on the upper side of the paper plane of FIG. 2, and the liquid treating units 36 are disposed on the lower side of the paper plane of FIG. 2. In this regard, in the first treating block 3, the heat treating units 37 are disposed on the upper side of the paper plane of FIG. 2, and the liquid treating units 36 are disposed on the lower side of the paper plane. In contrast to this, in the second treating block 5, the liquid treating units 36 may be disposed on the upper side of the paper plane of FIG. 2, and the heat treating units 37 may be disposed on the lower side of the paper plane of FIG. 2. That is, the arrangement of the liquid treating units 36 and the heat treating units 37 of the first treating block 3 may be reversed across the transportation space 39 with respect to the arrangement of the liquid treating units 36 and the heat treating units 37 of the second treating block 5.

(3) In the first embodiment described above, the IF block 6 is connected to the second treating block 5. In this regard, the IF block 6 may be connected to the first treating block 3. In this case, types, numbers, and arrangement of the liquid treating units 36 and the heat treating units 37 of the six treatment layers (such as A1) are determined depending on the arrangement of the IF block 6, Further, the first treating block 3 and the IF block 6 correspond to the first treating device in the present invention. The second treating block 5 corresponds to the second treating device in the present invention.

(4) In the first and second embodiments described above, the substrate treatment is performed in the order of the treatment layers A1, B1, C1 and in the order of the treatment layers A2, B2, C2. In this regard, the substrate treatment may be performed in the order of the treatment layers A2, B1, C1 and in the order of the treatment layers A1, B2, C2. In the third embodiment described above, the substrate treatment is performed in the order of the treatment layers A1, B1, C1 and in the order of the treatment layers A2, B2, C2. In this regard, the substrate treatment may be performed in the order of the treatment layers A1, B1, C2 and in the order of the treatment layers A2, B2, C1.

(5) In the third embodiment described above, the two treatment layers C1, C2 shown in FIG. 14 each include the four cooling units CP as the adjacent treating units AD. For example, the two cooling units CP of the four cooling units CP may be replaced by the two inspection units LSCM1. In this case, the first substrate transport mechanism MHU1 may directly transport the substrate W from the inspection unit LSCM1 of the treatment layers C1, for example, to the carrier C placed on the platform 16.

(6) In the embodiments and the modifications described above, an operator may arbitrarily set selection from either the first substrate transport mechanism MHU1 or the second substrate transport mechanism MHU2 in the substrate transportation in the ID block 2.

Figure 19:
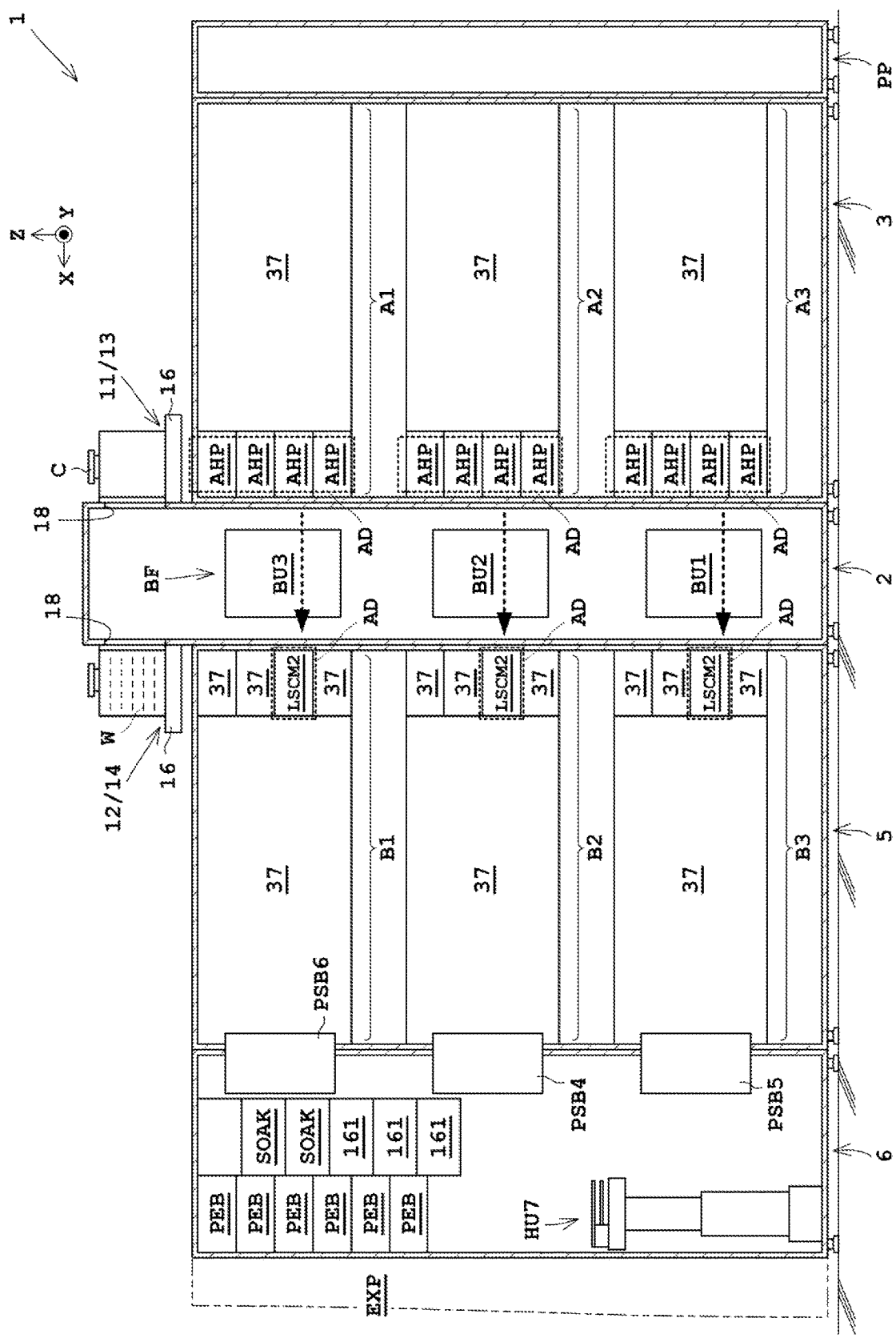
FIG. 19 is a left side view of a substrate treating apparatus according to the modification.

(7) Each of the embodiments described above may be configured as follows if necessary. Reference is made to FIG. 19. The three treatment layers A1 to A3 of the first treating block 3 each form the photoresist film. On the other hand, the three treatment layers B1 to B3 of the second treating block 5 each perform the developing treatment. The three treatment layers A1 to A3 each include four adhesion enhancing treatment units AHP or four cooling units CP as the adjacent treating units AD. Also, the three treatment layers B1 to B3 each include one inspection unit LSCM2 as adjacent treating unit AD. Note that the substrate treating apparatus 1 shown in FIG. 19 is configured so that not to transport any substrate W between the two treatment layers at the different height positions.

In the configuration shown in FIG. 19, the substrate transport mechanism MHU1 of the ID block 2 may, for example, directly transport the substrate W from the carrier C, placed on the platform 16, to at least one of the four adhesion enhancing treatment units AHP of, for example, the treatment layer A1, without passing through the buffer unit BU3. Moreover, the substrate transport mechanism MHU1 may also directly transport the substrate W from the inspection unit LSCM2 of the treatment layer B1 to the carrier C placed on the platform 16 without passing through the buffer unit BU3.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating system for treating a substrate, comprising:
    an indexer block where a platform for placing a carrier capable of accommodating a substrate is provided;
    a first treating block including a plurality of treatment layers arranged in an up-down direction; and
    a second treating block including a plurality of treatment layers arranged in the up-down direction,
    the first treating block, the indexer block, and the second treating block being connected in this order in a horizontal direction,
    the indexer block including a first indexer mechanism capable of taking a substrate into and out of a carrier placed on the platform, having a first indexer hand for holding a substrate, and being movable for transporting the substrate, and a substrate buffer configured to place a plurality of the substrates therein, and
    the first indexer mechanism transporting a substrate between two treatment layers disposed at different height positions in the first treating block and the second treating block, wherein
    the substrate buffer is disposed in the middle of the first treating block and the second treating block,
    the substrate buffer includes a plurality of substrate platforms arranged in the up-down direction for placing the substrate,
    the treatment layers of the first treating block and the second treating block each include a substrate transport mechanism having a hand for holding a substrate and being movable for transporting the substrate, and
    the substrate transport mechanism of each of the treatment layers is configured such that the hand can access the substrate buffer.

2. The substrate treating system according to claim 1, wherein
    the treatment layers of the first treating block and the second treating block each include a treating unit having a plate for placing the substrate thereon and configured to perform a predetermined treatment on the substrate,
    the substrate buffer includes a plurality of buffer units arranged in an up-down direction,
    the plurality of buffer units includes a plurality of substrate platforms arranged in the up-down direction for placing the substrate,
    when transporting a substrate between two treatment layers disposed at an equal height position in the first treating block and the second treating block, the substrate transport mechanism in each of the treatment layers delivers the substrate through the substrate buffer, and
    when transporting a substrate between two treatment layers disposed at different height positions in the first treating block and the second treating block, the first indexer mechanism transports the substrate between two buffer units of the substrate buffer disposed at height positions corresponding to the height positions of the treatment layers.

3. The substrate treating system according to claim 1, wherein
    the treatment layers of the first treating block and the second treating block each include a treating unit having a plate for placing the substrate thereon and configured to perform a predetermined treatment on the substrate, and
    when transporting a substrate between two treatment layers disposed at different height positions in the first treating block and the second treating block, the first indexer mechanism directly transports the substrate between two treating units of the two treatment layers without passing through the substrate buffer.

4. The substrate treating system according to claim 3, wherein
    when transporting a substrate between two treatment layers disposed at an equal height position in the first treating block and the second treating block, the substrate transport mechanism in each of the treatment layers delivers the substrate through the substrate buffer.

5. The substrate treating system according to claim 1, wherein
    the first indexer mechanism directly transports the substrate from the carrier placed on the platform to a treating unit of the treatment layer in at least either the first treating block or the second treating block without passing through the substrate buffer, and
    the treating unit includes a plate for placing a substrate thereon and configured to perform a predetermined treatment on the substrate.

6. The substrate treating system according to claim 5, wherein
    the first indexer mechanism includes a plurality of first indexer hands, takes a plurality of the substrates from the carrier placed on the platform simultaneously, and directly transports the substrates one by one to the treating unit of the treatment layer in at least either the first treating block or the second treating block without passing through the substrate buffer.

7. The substrate treating system according to claim 1, wherein
the first indexer mechanism directly transports the substrate from a treating unit of the treatment layer in at least either the first treating block or the second treating block to the carrier placed on the platform without passing through the substrate buffer, and
the treating unit includes a CCD-camera or an image sensor for performing a predetermined inspection on the substrate.

8. The substrate treating system according to claim 1, wherein
the treatment layers of the first treating block and the second treating block each include a treating unit having a plate for placing the substrate thereon and configured to perform a predetermined treatment on the substrate, and
when transporting a substrate between two treatment layers disposed at different height positions in the first treating block and the second treating block, the first indexer mechanism directly transports the substrate between the substrate buffer and the treating unit of one of the two treatment layers.

9. The substrate treating system according to claim 1, wherein
the indexer block further includes a second indexer mechanism having a second indexer hand for holding a substrate and being movable for transporting the substrate,
the second indexer mechanism is disposed opposite to the first indexer mechanism across the substrate buffer, and
the first indexer mechanism and the second indexer mechanism are arranged in a direction perpendicular with respect to a direction where the first treating block and the second treating block are arranged.

10. The substrate treating system according to claim 1, further comprising:
an adjacent treating unit adjacent to the first indexer block, disposed in the treatment layer of at least either the first treating block or the second treating block, and configured to receive the substrate directly transported by the first indexer mechanism without passing through the substrate buffer, and
the adjacent treating unit includes a plate for placing a substrate thereon and configured to perform a predetermined treatment on the substrate.

11. A substrate transporting method for a substrate treating system, the substrate treating system including:
an indexer block where a platform for placing a carrier capable of accommodating a substrate is provided;
a first treating block including a plurality of treatment layers arranged in an up-down direction; and
a second treating block including a plurality of treatment layers arranged in the up-down direction,
the first treating block, the indexer block, and the second treating block being connected in this order in a horizontal direction,
the indexer block including therein a first indexer mechanism capable of taking a substrate into and out of a carrier placed on the platform, having an indexer hand for holding a substrate, and being movable for transporting the substrate, and a substrate buffer configured to place a plurality of the substrates therein, the substrate transporting method comprising:
a transporting step of causing the first indexer mechanism to transport a substrate between two treatment layers disposed at different height positions in the first treating block and the second treating block, wherein
the substrate buffer is disposed in the middle of the first treating block and the second treating block,
the substrate buffer includes a plurality of substrate platforms arranged in the up-down direction for placing the substrate,
the treatment layers of the first treating block and the second treating block each include a substrate transport mechanism having a hand for holding a substrate and being movable for transporting the substrate, and
the substrate transport mechanism of each of the treatment layers is configured such that the hand can access the substrate buffer.

* * * * *